(12) United States Patent
Tsuboi

(10) Patent No.: US 10,043,813 B2
(45) Date of Patent: Aug. 7, 2018

(54) METHOD OF MANUFACTURING SEMICONDUCTOR DEVICE

(71) Applicant: RENESAS ELECTRONICS CORPORATION, Tokyo (JP)

(72) Inventor: Nobuo Tsuboi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/682,455

(22) Filed: Aug. 21, 2017

(65) Prior Publication Data

US 2017/0373072 A1    Dec. 28, 2017

Related U.S. Application Data

(62) Division of application No. 15/157,078, filed on May 17, 2016, now Pat. No. 9,741,725.

(30) Foreign Application Priority Data

Jul. 10, 2015  (JP) .................................. 2015-138369

(51) Int. Cl.
| | | |
|---|---|---|
| H01L 21/336 | (2006.01) | |
| H01L 27/11 | (2006.01) | |
| H01L 21/28 | (2006.01) | |
| H01L 29/786 | (2006.01) | |
| H01L 23/535 | (2006.01) | |

(Continued)

(52) U.S. Cl.
CPC .... *H01L 27/1108* (2013.01); *H01L 21/28008* (2013.01); *H01L 21/28052* (2013.01); *H01L 23/535* (2013.01); *H01L 29/4933* (2013.01); *H01L 29/4941* (2013.01); *H01L 29/786* (2013.01); *H01L 29/4916* (2013.01); *H01L 29/665* (2013.01); *H01L 29/7833* (2013.01)

(58) Field of Classification Search
CPC ............. H01L 21/28008; H01L 23/535; H01L 29/4916; H01L 29/4941; H01L 29/786
USPC .............................. 257/401, 66, 67, 903, 904
See application file for complete search history.

(56) References Cited

U.S. PATENT DOCUMENTS

| 8,043,900 | B2 | 10/2011 | Shimizu et al. |
| 2008/0073730 | A1* | 3/2008 | Lee ................. H01L 21/823431 |
| | | | 257/401 |

(Continued)

FOREIGN PATENT DOCUMENTS

JP    2010-067799 A    3/2010

*Primary Examiner* — Long K Tran
(74) *Attorney, Agent, or Firm* — McDermott Will & Emery LLP

(57) ABSTRACT

A semiconductor device can be reduced in size. The semiconductor device has a first conductivity type p type well layer extending in the X direction of the main surface of a semiconductor substrate; a reference potential wire coupled with the p type well layer, and extending in the X direction; first and second active regions arranged on the opposite sides of the reference potential wire in the Y direction; and a gate electrode layer extending in the Y direction in such a manner as to cross with the first and second active regions. Then, the gate electrode layer has a first gate electrode of a second conductivity type at the crossing part with the first active region, a second gate electrode of the second conductivity type at the crossing part with the second active region, and a non-doped electrode between the first gate electrode and the second gate electrode.

4 Claims, 31 Drawing Sheets

(51) Int. Cl.
    *H01L 29/66*     (2006.01)
    *H01L 29/49*     (2006.01)
    *H01L 29/78*     (2006.01)

(56) References Cited

U.S. PATENT DOCUMENTS

2010/0059794 A1    3/2010  Shimizu et al.
2010/0237404 A1    9/2010  Toba et al.

* cited by examiner

METHOD OF MANUFACTURING SEMICONDUCTOR DEVICE

CROSS-REFERENCE TO RELATED APPLICATIONS

The present application is a divisional of U.S. patent application Ser. No. 15/157,078, filed May 17, 2016, which claims priority from Japanese Patent Application No. 2015-138369 filed on Jul. 10, 2015, the contents of which are hereby incorporated by reference into this application.

BACKGROUND

The present invention relates to a semiconductor device. More particularly, the present invention relates to a technology effectively applicable to a semiconductor device having circuit cells arranged in a multi-stage form.

FIG. 1 of Japanese Unexamined Patent Application Publication No. 2010-67799 (Patent Document 1) discloses a circuit cell for forming a logic circuit. The circuit cell has a wire 4V for supplying a power supply potential VDD, and a wire 4G for supplying a reference potential GND, extending in parallel with each other in the transverse direction in the drawing. A plurality of n channel type MISFETs and a plurality of p channel type MISFETs are arrayed between the wires 4V and 4G. Then, the circuit cells are arranged in a multi-layer form in the longitudinal direction in the drawing. Incidentally, the width of the circuit cell in the direction orthogonal to the wires 4V and 4G is referred to as the height of the circuit cell.

PATENT DOCUMENT

[Patent Document 1] Japanese Unexamined Patent Application Publication No. 2010-67799

SUMMARY

With a trend toward higher function of a semiconductor device, the number of logic circuits mounted in the semiconductor device has been more and more increasing. Accordingly, the number of stages of the circuit cells for forming the logic circuits tends to remarkably increase. Therefore, in order to implement the size reduction of a semiconductor device, a technology of reducing the height of the circuit cell has been required.

Other objects and novel features will be apparent from the description of this specification and the accompanying drawings.

In accordance with one embodiment, a semiconductor device has a semiconductor substrate having a main surface; a first semiconductor region of a first conductivity type extending in a first direction of the main surface; a first wire coupled with the first semiconductor region, and arranged over the semiconductor substrate in such a manner as to extend in the first direction; and a first active region and a second active region formed in the first semiconductor region, and arranged on the opposite sides of the first wire in a second direction orthogonal to the first direction. Further, the semiconductor device has a gate electrode layer formed over the main surface, and extending in the second direction in such a manner as to cross with the first active region and the second active region; and a pair of second semiconductor regions having a second conductivity type of the opposite conductivity type to the first conductivity type, and formed on the opposite sides of the gate electrode layer in the first active region; and a pair of third semiconductor regions having the second conductivity type, and formed on the opposite sides of the gate electrode layer in the second active region. Then, the gate electrode layer has a first gate electrode of the second conductivity type at the crossing part with the first active region, a second gate electrode of the second conductivity type at the crossing part with the second active region, and a non-doped region between the first gate electrode and the second gate electrode.

In accordance with one embodiment, the size reduction of a semiconductor device can be implemented.

DETAILED DESCRIPTION

Figure 1:
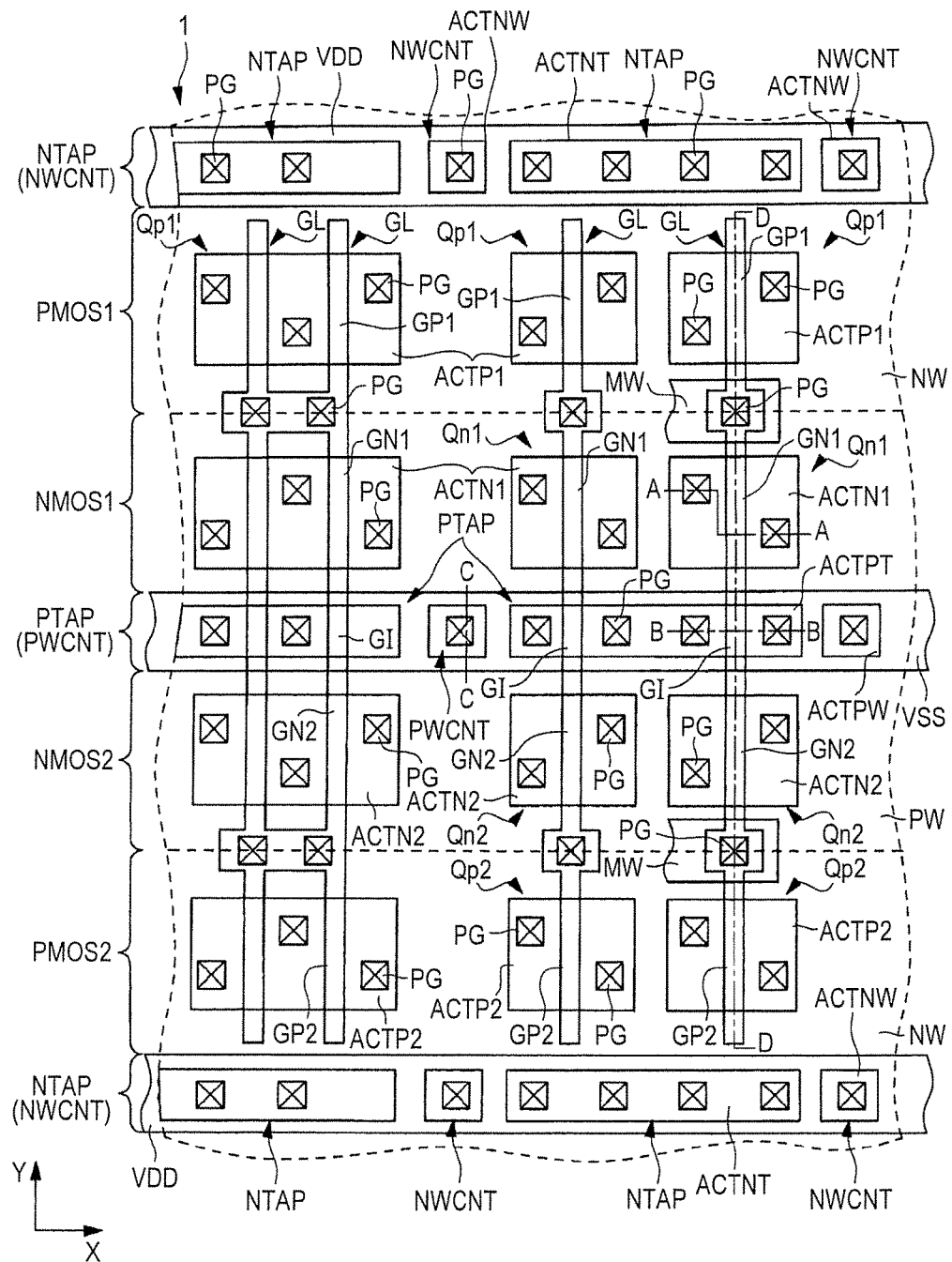
FIG. 1 is an essential part plan view of a semiconductor device in accordance with First Embodiment.

In the following description of embodiments, the description may be divided into a plurality of sections, or embodiments for convenience, if required. However, unless otherwise specified, these are not independent of each other, but, are in a relation such that one is a modified example, a detailed explanation, a complementary explanation, or the like of a part or the whole of the other. Further, in the following embodiments, when a reference is made to the number of elements, and the like (including number, numerical value, quantity, range, or the like), the number of elements is not limited to the specific number, but maybe greater than or less than the specific number, unless otherwise specified, except for the case where the number is apparently limited to the specific number in principle, or except for other cases . Further, in the following embodiments, it is naturally understood that the constitutional elements (including element steps, or the like) are not always essential, unless otherwise specified, except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, or except for other cases. This also applies to the foregoing numerical values and ranges.

Below, embodiments of the present invention will be described in details by reference to the accompanying drawings. Incidentally, in all the drawings for describing the following embodiments, those having the same function are given the same reference signs and numerals, and a repeated description thereon is omitted. Further, in the following embodiments, a description on the same or similar part will not be repeated in principle, unless otherwise required.

Further, in the drawings for use in the embodiments, hatching may be omitted even in cross sectional views for ease of understanding of the drawings . Whereas, hatching may be added even in plan views for ease of understanding of the drawings.

First Embodiment

A semiconductor device of the present embodiment has an input/output circuit, and an internal circuit. A signal inputted from outside the semiconductor device is processed via the input/output circuit at the internal circuit, and is outputted via the input/output circuit to the outside. The internal circuit has, for example, logic circuits such as a CPU. The logic circuit is formed of circuit cells. The operating voltage of the input/output circuit is, for example 3.3 V. However, for a lower power consumption of the semiconductor device, the operating voltage of the internal circuit is, for example, 0.4 V.

Whereas, the internal circuit is formed using a thin film n type MISFET (Metal Insulator Semiconductor Field Effect Transistor) and a thin film p type MISFET. The input/output circuit is formed using a bulk n type MISFET and a bulk p type MISFET. The thin film MISFET is of a structure referred to as a FD-SOI (Fully-Depleted Silicon on Insulator: fully depleted type SOI), and more specifically, of a structure referred to as a SOTB (Silicon on thin buried oxide), which enables a low voltage operation.

A thin film MISFET is formed at a semiconductor layer selectively formed via a buried insulation layer at the surface of a semiconductor substrate formed of silicon. On the other hand, a bulk MISFET is formed at the surface of the semiconductor substrate.

<Structure of Semiconductor Device>

Figure 2:
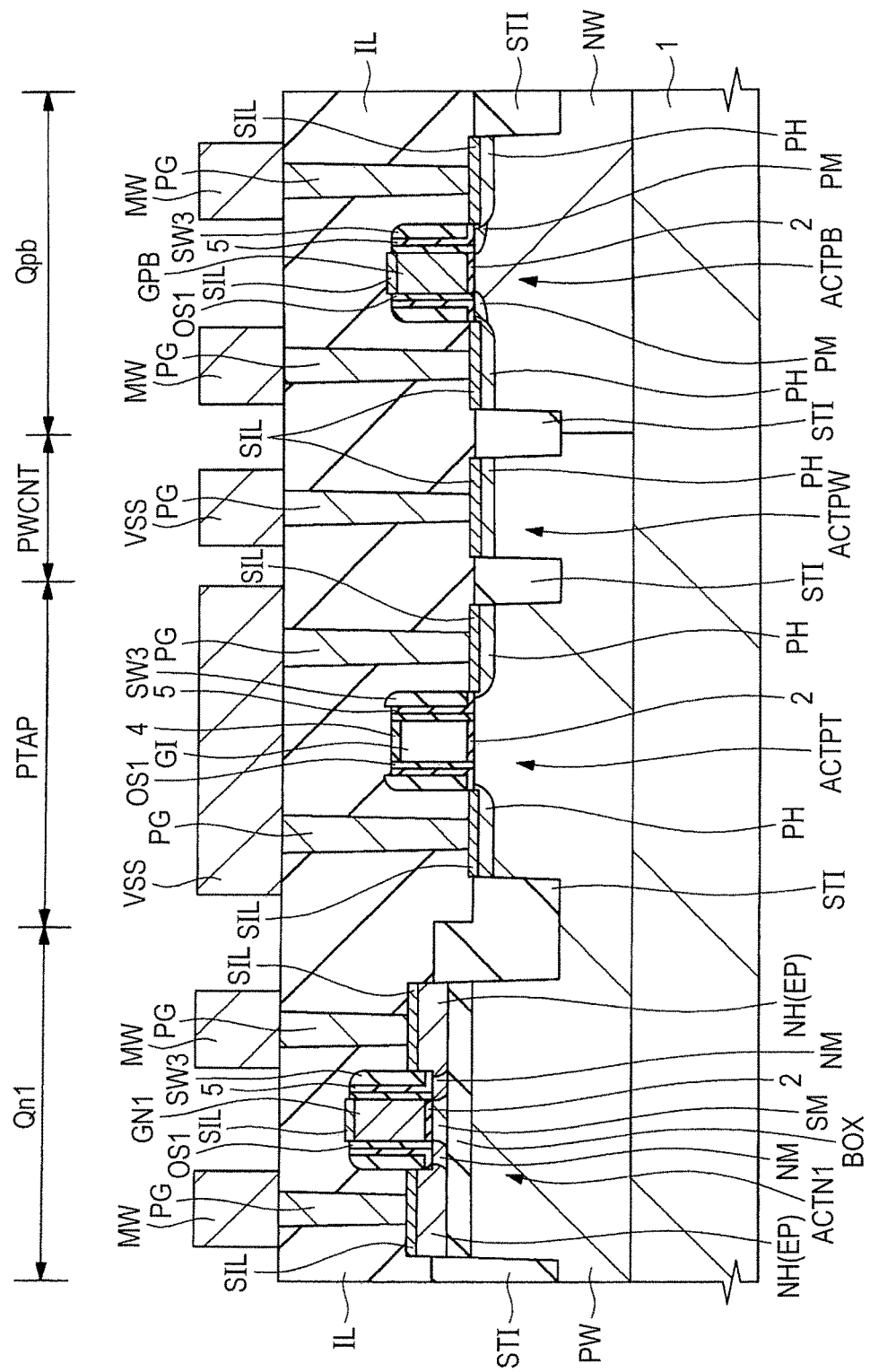
FIG. 2 is an essential part cross sectional view of the semiconductor device in accordance with First Embodiment.
Figure 3:
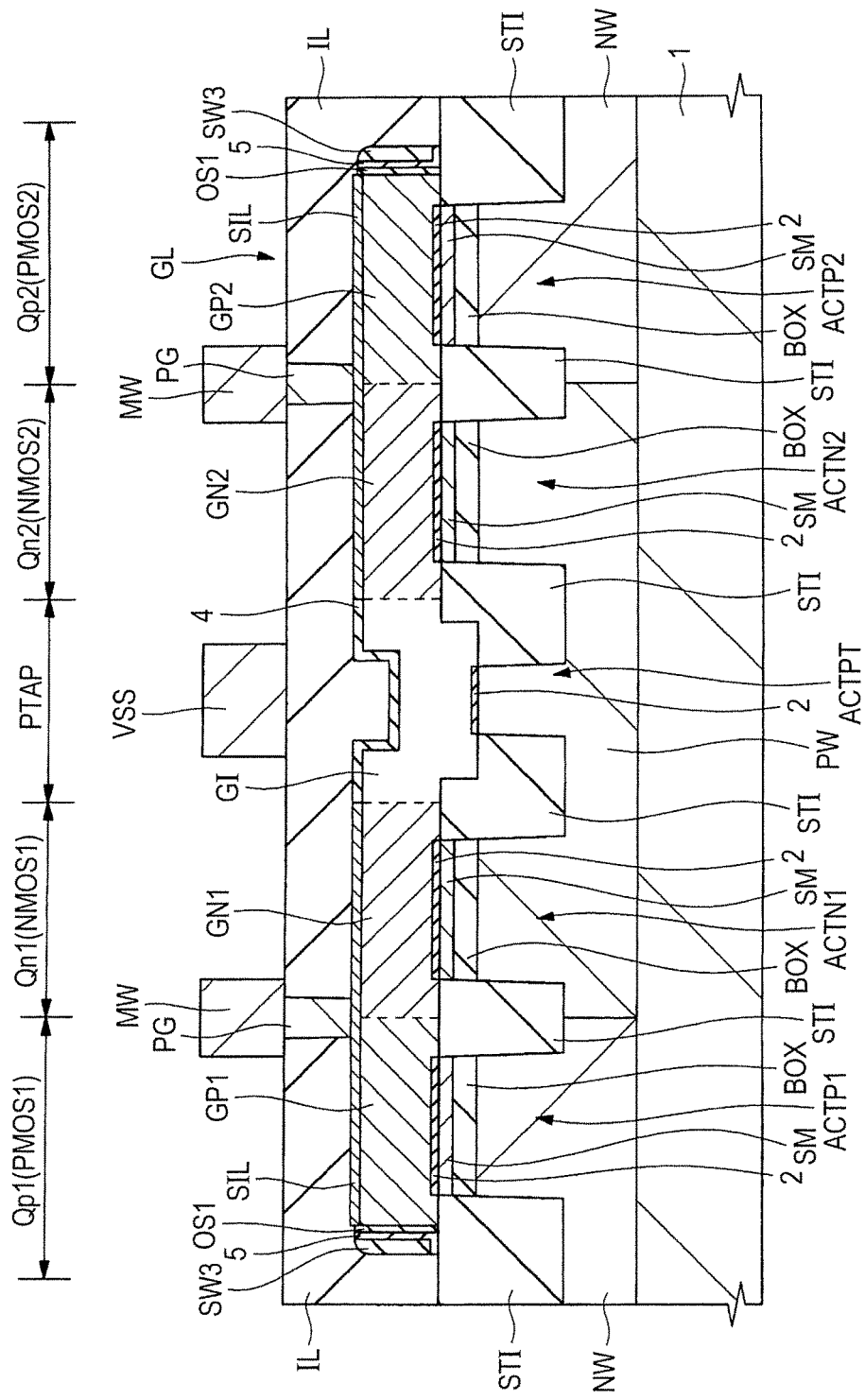
FIG. 3 is an essential part cross sectional view of the semiconductor device in accordance with First Embodiment.

FIG. 1 is an essential part plan view of a semiconductor device in accordance with First Embodiment . FIGS. 2 and 3 are each an essential part cross sectional view of the semiconductor device in accordance with First Embodiment. FIG. 1 is a plan view showing some of the circuit cells. The circuit cells extending in the X direction are arranged in two stages in the Y direction. FIG. 2 shows a cross sectional view of a thin film n type MISFET Qn1 (A-A cross section of FIG. 1), a cross sectional view of a p type tap PTAP (B-B cross section of FIG. 1), a cross sectional view of a p type well power feeder PWCNT (C-C cross section of FIG. 1), and a cross sectional view of a bulk p type MISFET Qpb. FIG. 3 is a D-D cross section of FIG. 1, and each cross sectional view of a thin film p type MISFET Qp1, a thin film n type MISFET Qn1, a p type tap PTAP, a thin film n type MISFET Qn2, and a thin film p type MISFET Qp2.

A first circuit cell situated on the upper side of FIG. 1 has a power supply potential wire VDD and a reference potential wire VSS extending in the X direction, and has a PMOS formation region PMOS1 and an NMOS formation region NMOS1 between the power supply potential wire VDD and the reference potential wire VSS. In the PMOS formation region PMOS1, a plurality of thin film p type MISFETs Qp1 are arranged, and in the NMOS formation region NMOS1, a plurality of thin film n type MISFETs Qn1 are arranged, along the X direction, respectively. Herein, the X direction and the Y direction are directions orthogonal to each other.

The thin film p type MISFET Qp1 has a gate electrode GP1 formed in an active region ACTP1 in a rectangular shape, and extending in the Y direction, and a source region and a drain region formed at the opposite ends of the gate electrode GP1 in the the X direction. The source region and the drain region are coupled with a metal wire not shown via a plug electrode PG. Under the active region ACTP1, an n type well layer NW is arranged.

The thin film n type MISFET Qn1 also similarly has a gate electrode GN1 formed in an active region ACTN1 in a rectangular shape, and extending in the Y direction, and a source region and a drain region formed at the opposite ends of the gate electrode GN1 in the the X direction. The source region and the drain region are coupled with a metal wire not shown via a plug electrode PG. Under the active region ACTN1, a p type well layer PW is arranged.

The gate electrodes GP1 and GN1 are integrally formed at a gate electrode layer GL extending in the Y direction, and are coupled with a metal wire MW via a plug electrode PG in the region between the active regions ACTP1 and ACTN1.

The power supply potential wire VDD and the reference potential wire VSS, and the metal wire MW are each formed of an aluminum wire including aluminum as a main component, or a copper wire including copper as a main component. As shown in FIG. 1, under the power supply potential wire VDD, an n type tap NTAP and an n type well power feeder NWCNT are arranged. In the active region ACTNT of the n type tap NTAP and the active region ACTNW of an n type well power feeder NWCNT, an n type semiconductor region is formed. The n type semiconductor region is formed in the n type well layer NW, and is in contact with the n type well layer NW. In other words, the n type well layer NW is coupled with the power supply potential wire VDD via the n type semiconductor region and the plug electrode PG. Thus, to the n type well layer NW, a power supply potential is fed from the power supply potential wire VDD.

Whereas, also in the case of the reference potential wire VSS, similarly, a p type tap PTAP and a p type well power feeder PWCNT are arranged thereunder. In the active region ACTPT of the p type tap PTAP and the active region ACTPW of the p type well power feeder PWCNT, a p type semiconductor region is formed. The p type semiconductor region is formed in the p type well layer PW, and is in contact with the p type well layer PW. In other words, the p type well layer PW is coupled with the reference potential wire VSS via the p type semiconductor region and the plug electrode PG. To the p type well layer PW, a reference potential is fed from the reference potential wire VSS.

The n type well power feeder NWCNT and the p type well power feeder PWCNT are each arranged in a region not overlapping the active region ACTP1 or ACTN1 in the the Y direction. In other words, the n type well power feeder NWCNT is arranged between the two active regions ACTP1. Whereas, the p type well power feeder PWCNT is arranged between the two active regions ACTN1.

The circuit cells extending in the X direction are arranged in a multi-stage form in the Y direction. As shown in FIG. 1, a second circuit cell adjacent to the first circuit cell is the first circuit cell arranged line symmetrically with respect to the reference potential wire VSS. In other words, the NMOS formation region NMOS1 of the first circuit cell and the NMOS formation region NMOS2 of the second circuit cell can be arranged in a single p type well layer PW. For this reason, the height (width) of the circuit cell in the Y direction can be reduced. In the same manner, the second circuit cell is arranged line symmetrically with respect to the power supply potential wire VDD. As a result, a third circuit cell can be formed. Repetition of the same operation can form an nth circuit cell.

As with the first circuit cell, the second circuit cell has a PMOS formation region PMOS2 and and an NMOS formation region NMOS2. In the PMOS formation region PMOS2, a plurality of thin film p type MISFETs Qp2 are arranged, and in the NMOS formation region NMOS2, a plurality of thin film n type MISFETs Qn2 are arranged, along the X direction, respectively. The thin film p type MISFET Qp2 has a gate electrode GP2 formed in an active region ACTP2 in a rectangular shape, and extending in the Y direction, and a source region and a drain region formed at the opposite ends thereof. The thin film n type MISFET Qn2 also similarly has a gate electrode GN2 formed in an active region ACTN2 in a rectangular shape, and extending in the Y direction, and a source region and a drain region formed at the opposite ends thereof. Others are the same as those described for the first circuit cell.

The thin film n type MISFET Qn2 and the active region ACTN2 of the second circuit cell are formed in the p type well layer PW in which the thin film n type MISFET Qn1 and the active region ACTN1 of the first circuit cell are formed. In other words, the thin film n type MISFET Qn1 and the active region ACTN1 of the first circuit cell, and the thin film n type MISFET Qn2 and the active region ACTN2 of the second circuit cell are formed in a single p type well layer PW. Then, the reference potential wire VSS extends in the X direction between the active regions ACTN1 and ACTN2 in the Y direction. A reference potential is fed from the reference potential wire VSS to the single p type well layer PW. The first circuit cell and the second circuit cell have the reference potential wire VSS in common.

A feature of the present First Embodiment resides in that the gate electrode GN1 of the thin film n type MISFET Qn1 of the first circuit cell, and the gate electrode GN2 of the thin film n type MISFET Qn2 of the second circuit cell are integrally formed at the gate electrode layer GL. In other words, the gate electrode GN1 of the thin film n type MISFET Qn1 and the gate electrode GN2 of the thin film n type MISFET Qn2 are in an integral structure. However, the gate electrode layer GL has a non-doped region GI between the gate electrode GN1 and the gate electrode GN2. The gate electrodes GN1 and GN2 are electrically insulated (isolated) by the non-doped region GI. The gate electrode layer GL crosses with the reference potential wire VSS extending in the X direction between the thin film n type MISFET Qn1 of the first circuit cell and the thin film n type MISFET Qn2 of the second circuit cell, and extends in the Y direction. The non-doped region GI is arranged at a position overlapping the reference potential wire VSS.

Whereas, the gate electrode GP1 of the thin film p type MISFET Qp1 and the gate electrode GN1 of the thin film n type MISFET Qn1 of the first circuit cell, and the gate electrode GP2 of the thin film p type MISFET Qp2 and the gate electrode GN2 of the thin film n type MISFET Qn2 of the second circuit cell are integrally formed at the gate electrode layer GL. However, the gate electrode GN1 of the thin film n type MISFET Qn1 and the gate electrode GN2 of the thin film n type MISFET Qn2 are electrically insulated (isolated) from each other as described above.

Then, by reference to FIG. 2, a description will be given to the structure of the thin film n type MISFET Qn1 forming the first circuit cell. The thin film n type MISFET Qn2 forming the second circuit cell also has the same structure.

The thin film n type MISFET Qn1 is formed at a semiconductor layer SM formed over a p type semiconductor substrate 1 formed of, for example, silicon via a buried insulation film BOX. Whereas, the thin film n type MISFET Qn1 is formed in the inside of the active region ACTN1 at the surface of the semiconductor layer SM. The active region ACTN1 is surrounded by an element isolation film STI. The element isolation film STI defines the active region ACTN1. The buried insulation film BOX is formed of, for example, a silicon oxide film having a film thickness of about 10 nm, and insulates and isolates the semiconductor layer SM from the semiconductor substrate 1. The semiconductor layer SM is formed of, for example, a silicon film having a film thickness of about 10 to 15 nm. In FIG. 2, the region of the semiconductor layer SM situated under the gate electrode GN1 forms the channel region of the thin film n type MISFET Qn1, and is not doped with an impurity. The regions of the semiconductor layer SM indicated with NM and NH are doped with an n type impurity.

Over the semiconductor layer SM, the n type gate electrode GN1 is formed via a gate insulation film 2. The gate insulation film 2 is formed of a silicon oxide film, a silicon oxynitride film, a high dielectric constant film referred to as a high-k film, or the like. The gate electrode GN1 is formed of a polycrystal silicon film (polysilicon film) doped with an n type impurity.

The gate electrode GN1 has opposing sidewalls in the channel length direction (the transverse direction of FIG. 2) of the thin film n type MISFET Qn1. Over each sidewall, an offset spacer OS1 formed of a silicon nitride film is formed, and covers the entire sidewall of the gate electrode GN1. Then, over the offset spacer OS1, an insulation film 5 formed of a silicon oxide film and a sidewall insulation film SW3 formed of a silicon nitride film are formed. The insulation film 5 and the sidewall insulation film SW3 cover the entire sidewall of the gate electrode GN1 via the offset spacer OS1.

N type low concentration semiconductor regions NM and n type high concentration semiconductor regions NH are respectively formed on each opposite side of the gate electrode GN1 in such a manner as to interpose the gate electrode GN1 therebetween in the channel length direction. The n type low concentration semiconductor region NM and the n type high concentration semiconductor region NH serve as the source region or the drain region of the thin film n type MISFET Qn1. In other words, the n type low concentration semiconductor region NM and the n type high concentration semiconductor region NH correspond to the n type semiconductor regions. The n type impurity concentration of the n type high concentration semiconductor region NH is a higher concentration than the n type impurity concentration of the n type low concentration semiconductor region NM. The n type high concentration semiconductor region NH is arranged more distant from the gate electrode GN1 than the n type low concentration semiconductor region NM. The n type low concentration semiconductor region NM and the n type high concentration semiconductor region NH are in contact with the buried insulation film BOX. Incidentally, the n type high concentration semiconductor region NH is fowled across the semiconductor layer SM, and an epi-layer EP obtained by selectively growing silicon over the semiconductor layer SM. Accordingly, the top surface (the interface with the silicide layer SIL) of the n type high concentration semiconductor region NH is higher than the top surface (the interface with the gate insulation film 2) of the semiconductor layer SM.

Silicide layers SIL are formed at the surfaces (top surfaces) of the gate electrode GN1 and the n type high concentration semiconductor regions NH. This reduces the resistances of the source region, the drain region, and the gate electrode GN1 of the thin film n type MISFET Qn1. The source region and the drain region of the thin film n type MISFET Qn1 are coupled with a metal wire MW of a conductor via a plug electrode PG of a conductor. The plug electrode PG is provided in an interlayer insulation film IL covering the thin film n type MISFET Qn1.

As also shown in FIG. 1, the thin film n type MISFET Qn1 is formed in the p type well layer PW formed at the surface of the semiconductor substrate 1. In other words, under the active region ACTN1 in which the thin film n type MISFET Qn1 is formed, the p type well layer PW is formed entirely over the active region ACTN1.

The thin film p type MISFET Qp1 has the same structure as that of the thin film n type MISFET Qn1. However, respective conductivity types of the gate electrodes, the semiconductor layers, the low concentration semiconductor regions, the high concentration semiconductor regions, and the well layers are inverted.

Then, a p type tap PTAP is formed in an active region ACTPT at the surface of the semiconductor substrate 1. The p type tap PTAP and the active region ACTPT are formed in the same p type well layer PW as that for the thin film n type MISFET Qn1. At the surface of the p type well layer PW, a non-doped region GI is formed via a gate insulation film 2. The top surface of the non-doped region GI is covered with a cap insulation film 4 formed of a silicon nitride film. Over the sidewall of the non-doped region GI, the same offset spacer OS1, insulation film 5, and sidewall insulation film SW3 as those of the thin film n type MISFET Qn1 are sequentially formed. P type high concentration semiconductor regions PH are formed at the surfaces of the semiconductor substrate 1 (p type well region PW) on the opposite ends of the non-doped region GI in such a manner as to interpose the non-doped region GI therebetween. A silicide layer SIL is formed at the surface of each p type high concentration semiconductor region PH. The silicide layer SIL is coupled with the reference potential wire VSS via the plug electrode PG. In other words, for the p type tap PTAP, the reference potential applied to the reference potential wire VSS is applied to the p type well layer PW via the plug electrode PG, the silicide layer SIL, and the p type high concentration semiconductor region PH.

Incidentally, the top surface of the non-doped region GI is covered with the cap insulation film 4. For this reason, a silicide layer SIL is not formed. Whereas, the non-doped region GI is not ion-implanted (doped) with a p type or n type impurity, and becomes an amorphous silicon film.

Then, the p type well power feeder PWCNT is formed in the active region ACTPW at the surface of the semiconductor substrate 1. The p type well power feeder PWCNT is folioed in the p type well layer PW. In the active region ACTPW, a p type high concentration semiconductor region PH is formed. Further, at the top surface of the p type high concentration semiconductor region PH, a silicide layer SIL is formed. The silicide layer SIL is coupled via a plug electrode PG with the reference potential wire VSS. In other words, in the p type well power feeder PWCNT, the reference potential applied to the reference potential wire VSS is applied via the plug electrode PG, the silicide layer SIL, and the p type high concentration semiconductor region PH, to the p type well layer PW. The p type well power feeder PWCNT and the active region ACTPW are formed in the same p type well layer PW as that for the thin film n type MISFET Qn1.

Then, the structure of the bulk p type MISFET Qpb will be described. The bulk p type MISFET Qpb is formed in the inside of the active region ACTPB at the surface of the semiconductor layer SM. The active region ACTPB is formed in the n type well layer NW, and is surrounded by the element isolation films STI. The element isolation films STI define the active region ACTPB.

Over the semiconductor substrate 1 (n type well layer NW), a p type gate electrode GPB is formed via a gate insulation film 2. The gate insulation film 2 is formed of a silicon oxide film, a silicon oxynitride film, a high dielectric constant film referred to as a high-k film, or the like, but may also be formed with a different film thickness, and a different material from those of the gate insulation film 2 of the thin film n type MISFET Qn1. For example, the gate insulation film 2 of the bulk p type MISFET Qpb can also be formed so as to have a larger equivalent oxide thickness than that of the gate insulation film 2 of the thin film n type MISFET Qn1. The gate electrode GPB is formed of a polycrystal silicon film (polysilicon film), and is doped with a p type impurity.

The gate electrode GPB has opposing sidewalls in the channel length direction (the transverse direction of FIG. 2) of the bulk p type MISFET Qpb. Over each sidewall, an offset spacer OS1, an insulation film 5, and a sidewall insulation film SW3 are formed.

P type low concentration semiconductor regions PM and p type high concentration semiconductor regions PH are respectively formed on each opposite side of the gate electrode GPB in such a manner as to interpose the gate electrode GPB therebetween in the channel length direction. The p type low concentration semiconductor region PM and the p type high concentration semiconductor region PH become the source region or drain region of the bulk p type MISFET Qpb. The p type low concentration semiconductor region PM and the p type high concentration semiconductor region PH correspond to the p type semiconductor regions. The p type impurity concentration in the p type high concentration semiconductor region PH is a higher concentration than the p type impurity concentration in the p type low concentration semiconductor region PM. The p type high concentration semiconductor region PH is arranged more distant from the gate electrode GPB than the p type low concentration semiconductor region PM.

A silicide layer SIL is formed at each surface (top surface) of the gate electrode GPB and the p type high concentration semiconductor region PH. This reduces each resistance of the source region, the drain region, and the gate electrode GPB of the bulk p type MISFET Qpb. The source region and the drain region of the bulk p type MISFET Qpb is coupled with a metal wire MW of a conductor via a plug electrode PG of a conductor. The plug electrode PG is provided in the interlayer insulation film IL covering the bulk p type MISFET Qpb.

Incidentally, the bulk n type MISFET has the same structure as that of the bulk p type MISFET Qpb. For this reason, replacement of the p type with an n type in the description of the bulk p type MISFET Qpb results in the description of the structure of the bulk n type MISFET.

FIG. 3 is a D-D cross section of FIG. 1, and shows the cross sectional structures of the thin film p type MISFET Qp1, the thin film n type MISFET Qn1, the thin film n type MISFET Qn2, and the thin film p type MISFET Qp2 in the channel width direction (the direction orthogonal to the channel length direction).

In the transverse direction of FIG. 3, the active regions ACTP1, ACTN1, ACTPT, ACTN2, and ACTP2 are sequentially arranged. Respective active regions are interposed by the element isolation films STI. A gate electrode layer GL continuously extends over the active regions ACTP1, ACTN1, ACTPT, ACTN2, and ACTP2, and the element isolation films STI. Then, the gate electrode GP1 of the thin film p type MISFET Qp1, the gate electrode GN1 of the thin film n type MISFET Qn1, the non-doped region GI of the p type tap PTAP, the gate electrode GN2 of the thin film n type MISFET Qn2, and the gate electrode GP2 of the thin film p type MISFET Qp2 are formed at the gate electrode layer GL. In other words, the gate electrode GP1 of the thin film p type MISFET Qp1, the gate electrode GN1 of the thin film n type MISFET Qn1, the non-doped region GI of the p type tap PTAP, the gate electrode GN2 of the thin film n type MISFET Qn2, and the gate electrode GP2 of the thin film p type MISFET Qp2 are integrally formed at the gate electrode layer GL, resulting in an integral structure (a physically continuous structure).

The p type gate electrode GP1 extends over the active region ACTP1, and the element isolation films STI on the opposite sides thereof. The n type gate electrode GN1 extends over the active region ACTN1, and the element isolation films STI on the opposite sides thereof. The gate electrode GP1 and the gate electrode GN1 are adjacent to and coupled (in contact) with each other. A silicide layer SIL is continuously formed at the top surfaces of the gate electrode GP1 and the gate electrode GN1. The silicide layer SIL is coupled via the plug electrode PG with the metal wire MW. The gate electrode GP1 is a p type semiconductor layer (p type polycrystal silicon layer) doped with a p type impurity. The gate electrode GN1 is an n type semiconductor layer (n type polycrystal silicon layer) doped with an n type impurity. Both are electrically short-circuited to each other by the silicide layer SIL.

Whereas, the n type gate electrode GN2 extends over the active region ACTN2, and the element isolation films STI on the opposite sides thereof. The p type gate electrode GP2 extends over the active region ACTP2, and the element isolation films STI on the opposite sides thereof. The gate electrode GN2 and the gate electrode GP2 are adjacent to and coupled (in contact) with each other. The gate electrode GN2 is an n type semiconductor layer (n type polycrystal silicon layer) doped with an n type impurity. The gate electrode GP2 is a p type semiconductor layer (p type polycrystal silicon layer) doped with a p type impurity. A silicide layer SIL is continuously formed at the top surfaces of both. The silicide layer SIL is coupled via the plug electrode PG with the metal wire MW. In the same manner as described above, the gate electrode GN2 and the gate electrode GP2 are also electrically short-circuited to each other.

Further, the non-doped region GI extends over the active region ACTPT and the element isolation films STI on the opposite sides thereof, and is physically coupled (in contact) with the gate electrode GN1 and the gate electrode GN2. However, the non-doped region GI is an intrinsic semiconductor not containing a p type impurity or an n type impurity, and the non-doped region GI is formed of an amorphous silicon film. Further, the top surface of the non-doped region GI is covered with a cap insulation film 4, and a silicide layer SIL is not formed. Accordingly, the n type gate electrode GN1 and the n type gate electrode GN2 are electrically insulated from each other by the non-doped region GI. Thus, the leakage current between the gate electrodes GN1 and GN2 can be prevented by the non-doped region GI. Incidentally, the sheet resistance of the non-doped region GI formed of an amorphous silicon film is 1,000 KΩ/□ or more. Each sheet resistance of the gate electrodes GN1 and GN2 formed of an n type polycrystal silicon film is 130 Ω/□. Each sheet resistance of the gate electrodes GP1 and GP2 formed of a p type polycrystal silicon film is 330 Ω/□. The sheet resistance of the non-doped region GI is 1000 times or more each sheet resistance of the gate electrodes GN1 and GP1, and is a high resistance enough to prevent and reduce the leakage current between the gate electrodes GN1 and GN2. Thus, it can be said that an electrical insulation is ensured between the gate electrodes GN1 and GN2.

<Method for Manufacturing a Semiconductor Device>

Figure 23:
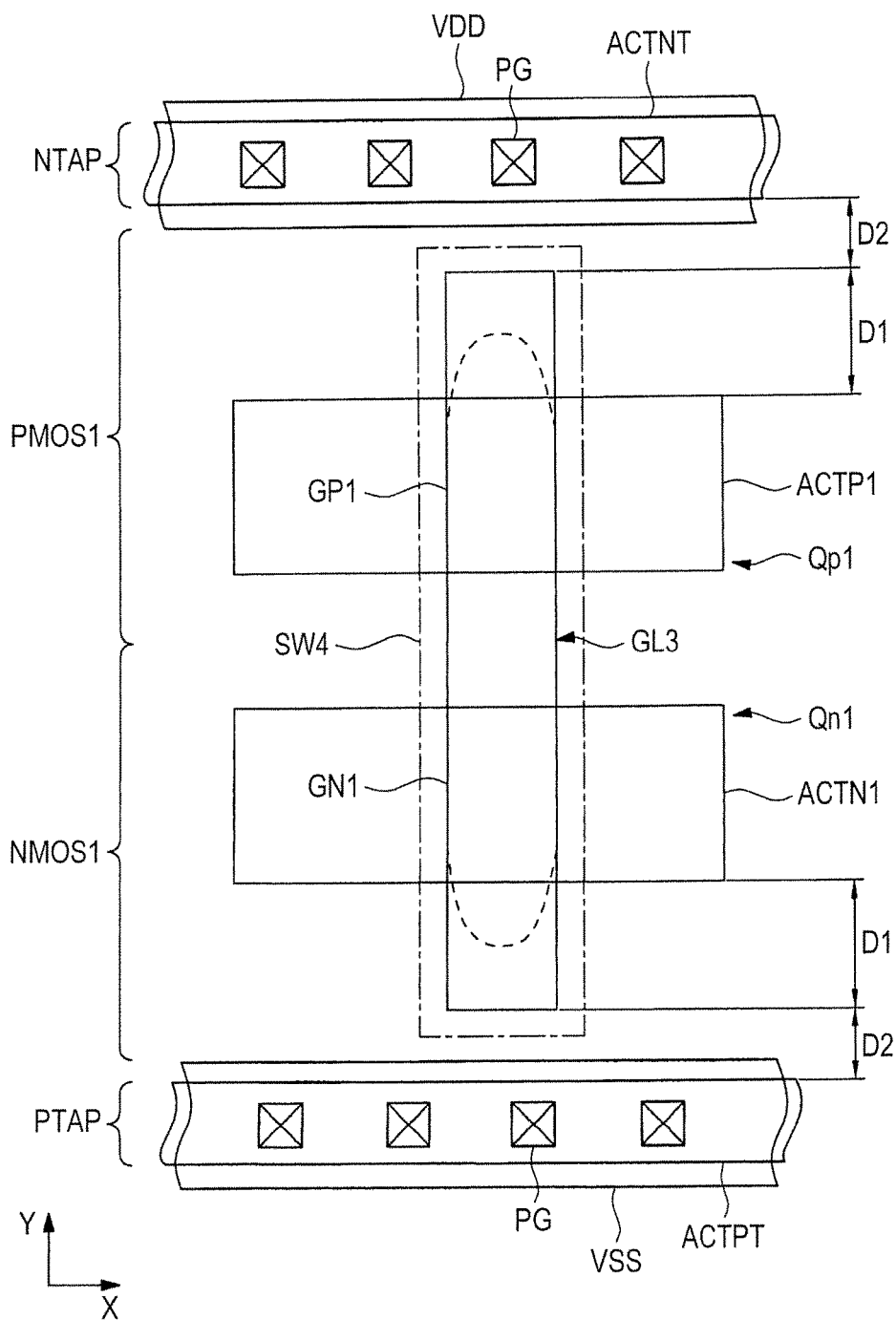
FIG. 23 is an essential part plan view of a semiconductor device of Study Example.
Figure 24:
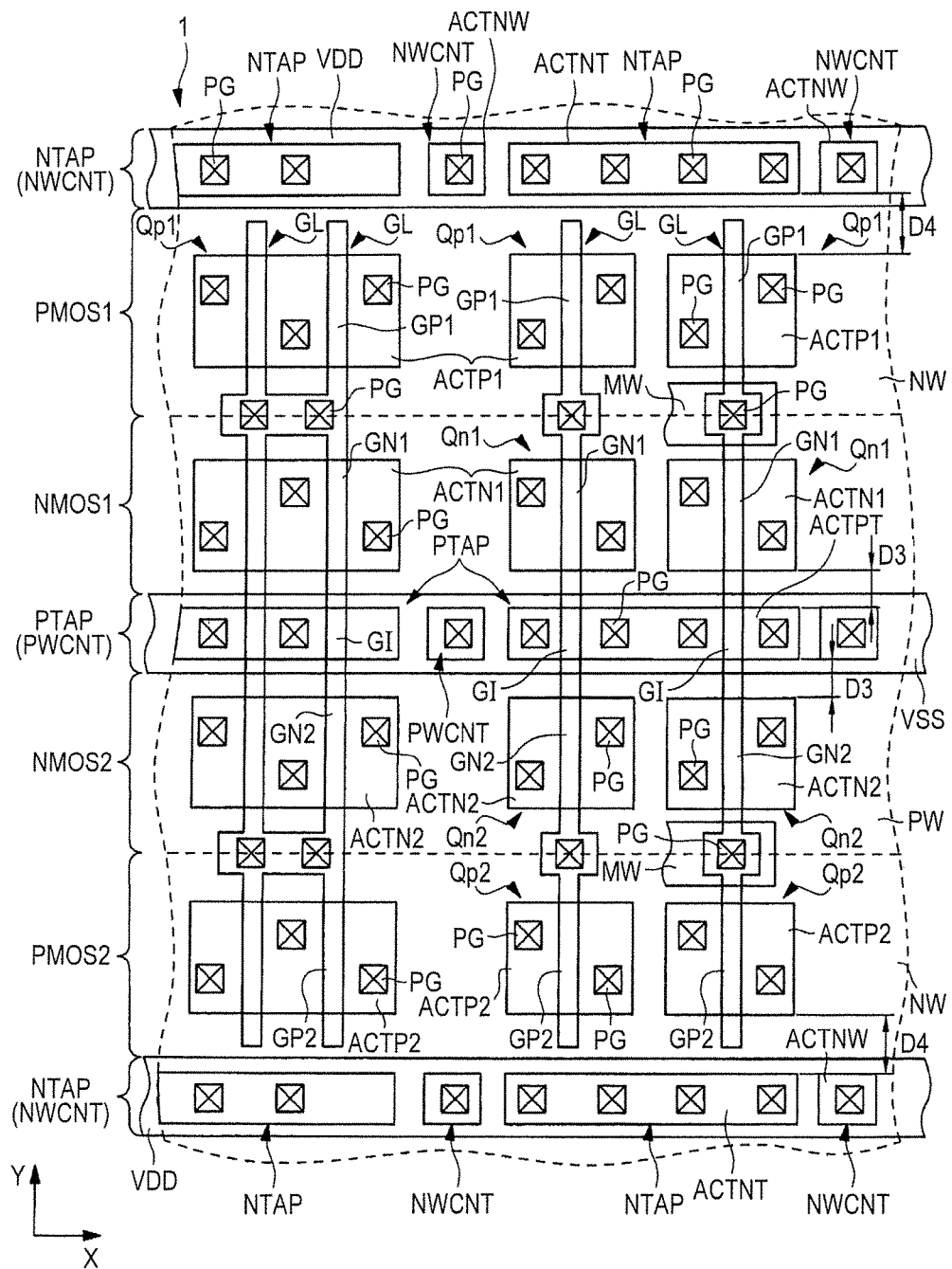
FIG. 24 is an essential part plan view for illustrating the effects of First Embodiment.

FIGS. 4 to 22 are each an essential part cross sectional view showing a semiconductor device during a manufacturing step in accordance with First Embodiment. FIGS. 4 to 8, 10, 11, 13, 15, 17, 19, and 21 are each an essential part cross sectional view of the semiconductor device in a manufacturing step corresponding to FIG. 2. FIGS. 9, 12, 14, 16, 18, 20, and 22 are each an essential part cross sectional view of the semiconductor device in a manufacturing step corresponding to FIG. 3. FIG. 23 is an essential part plan view of the semiconductor device of Study Example. FIG. 24 is an essential part plan view for illustrating the effects of First Embodiment.

Figure 4:
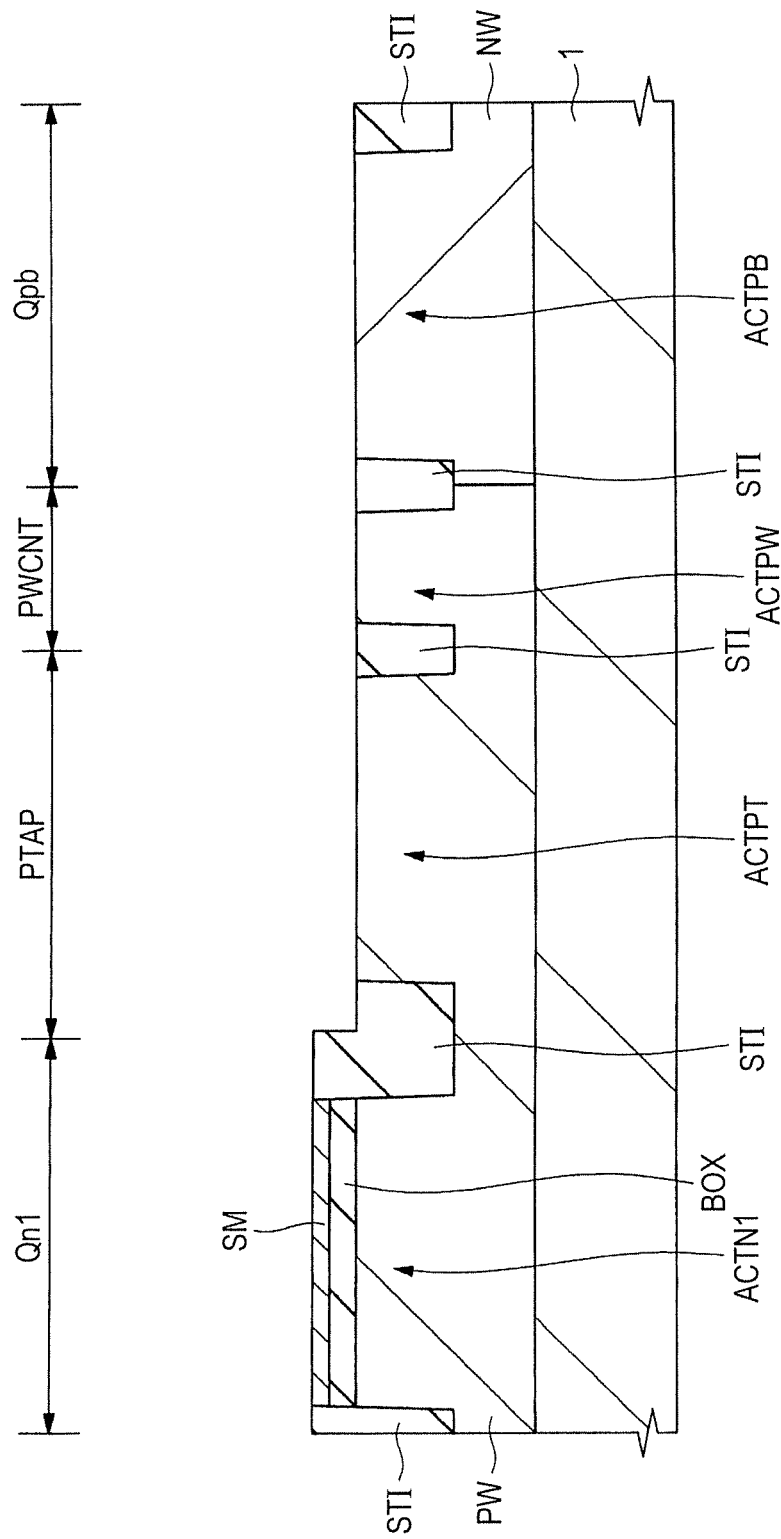
FIG. 4 is an essential part cross sectional view showing the semiconductor device in a manufacturing step in accordance with First Embodiment.

The method for manufacturing a semiconductor device has a step of providing a semiconductor substrate 1 as shown in FIG. 4. A p type well layer PW, an n type well layer NW, and element isolation films STI are formed at the surface of the p type semiconductor substrate 1. Then, the semiconductor substrate 1 has active regions ACTN1, ACTPT, ACTPW, and ACTPB defined by the element isolation films STI. In the active region ACTN1, a semiconductor layer SM is selectively formed via a buried insulation film BOX over the main surface of the semiconductor substrate 1. Namely, the buried insulation film BOX and the semiconductor layer SM in the active regions ACTPT, ACTPW, and ACTPB are selectively removed. Further, the active regions ACTN1, ACTPT, and ACTPW are formed in a single p type well layer PW, and the active region ACTPB is formed in the n type well layer NW.

The element isolation film STI is formed of an insulation film such as a silicon oxide film, or a lamination structure of a silicon nitride film and a silicon oxide film. The p type well layer PW or the n type well layer NW is a semiconductor region obtained by implanting a p type impurity into the semiconductor substrate 1, or a semiconductor region obtained by implanting an n type impurity thereinto.

Figure 5:
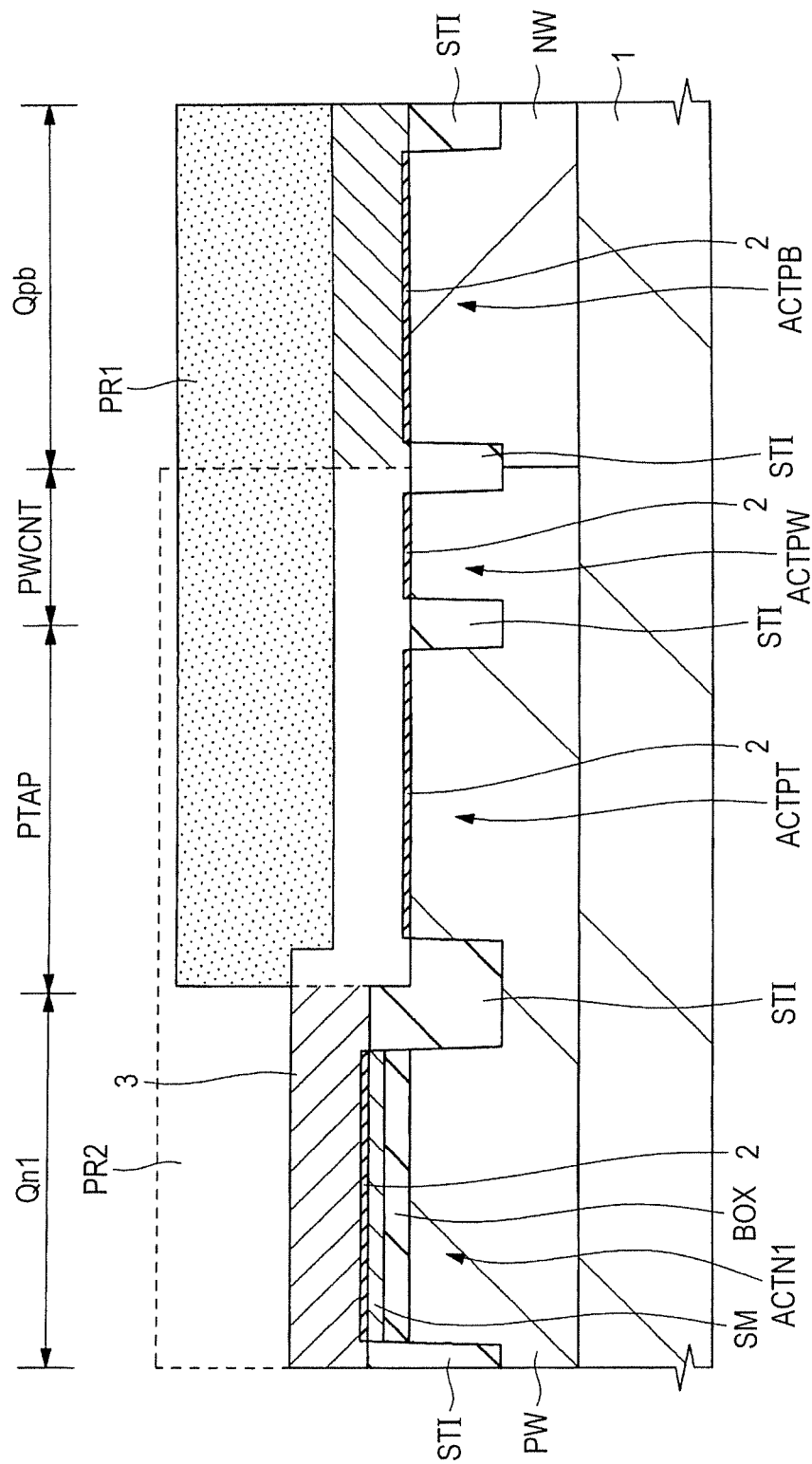
FIG. 5 is an essential part cross sectional view showing the semiconductor device in a manufacturing step in accordance with First Embodiment.

Then, as shown in FIG. 5, the steps of forming a gate insulation film 2 and a silicon film 3 are carried out . In the active regions ACTN1, ACTPT, ACTPW, and ACTPB, the gate insulation film 2 is formed over the semiconductor layer SM and the main surface of the semiconductor substrate 1. The gate insulation film 2 is formed of a silicon oxide film, a silicon oxynitride film, or a high dielectric constant film referred to as a high-k film. The film thickness and the film quality may vary among the active regions ACTN1, ACTPT, ACTPW, and ACTPB. Then, a silicon film 3 is formed over the semiconductor substrate 1. In other words, the silicon film 3 is deposited over the gate insulation film 2, and over the element isolation films STI by a CVD (Chemical Vapor Deposition) method, or the like. The deposited silicon film 3 does not contain an impurity, is an intrinsic semiconductor formed of an amorphous silicon film, and has a resistance of 1,000 KΩ/☐ or more.

Then, as shown in FIG. 5, a step of implanting an impurity into the silicon film 3 is carried out. First, a photoresist layer PR1 is formed which covers the formation regions of the p type tap PTAP, the p type well power feeder PWCNT, and the bulk p type MISFET Qpb, and exposes the formation region of the thin film n type MISFET Qn1. Using the photoresist layer PR1 as a mask, an ion implantation step is carried out. Then, the silicon film 3 in the formation region of the thin film n type MISFET Qn1 is doped with an n type impurity such as phosphorus (P), resulting in an n type semiconductor. Then, the photoresist layer PR1 is removed. Then, using a photoresist film PR2 covering the formation regions of the thin film n type MISFET Qn1, the p type tap PTAP, and the p type well power feeder PWCNT, and exposing the formation region of the bulk p type MISFET Qpb as a mask, the silicon film 3 in the bulk p type MISFET Qpb formation region is doped with a p type impurity such as boron (B), resulting in a p type semiconductor. Then, the photoresist layer PR2 is removed.

Figure 6:
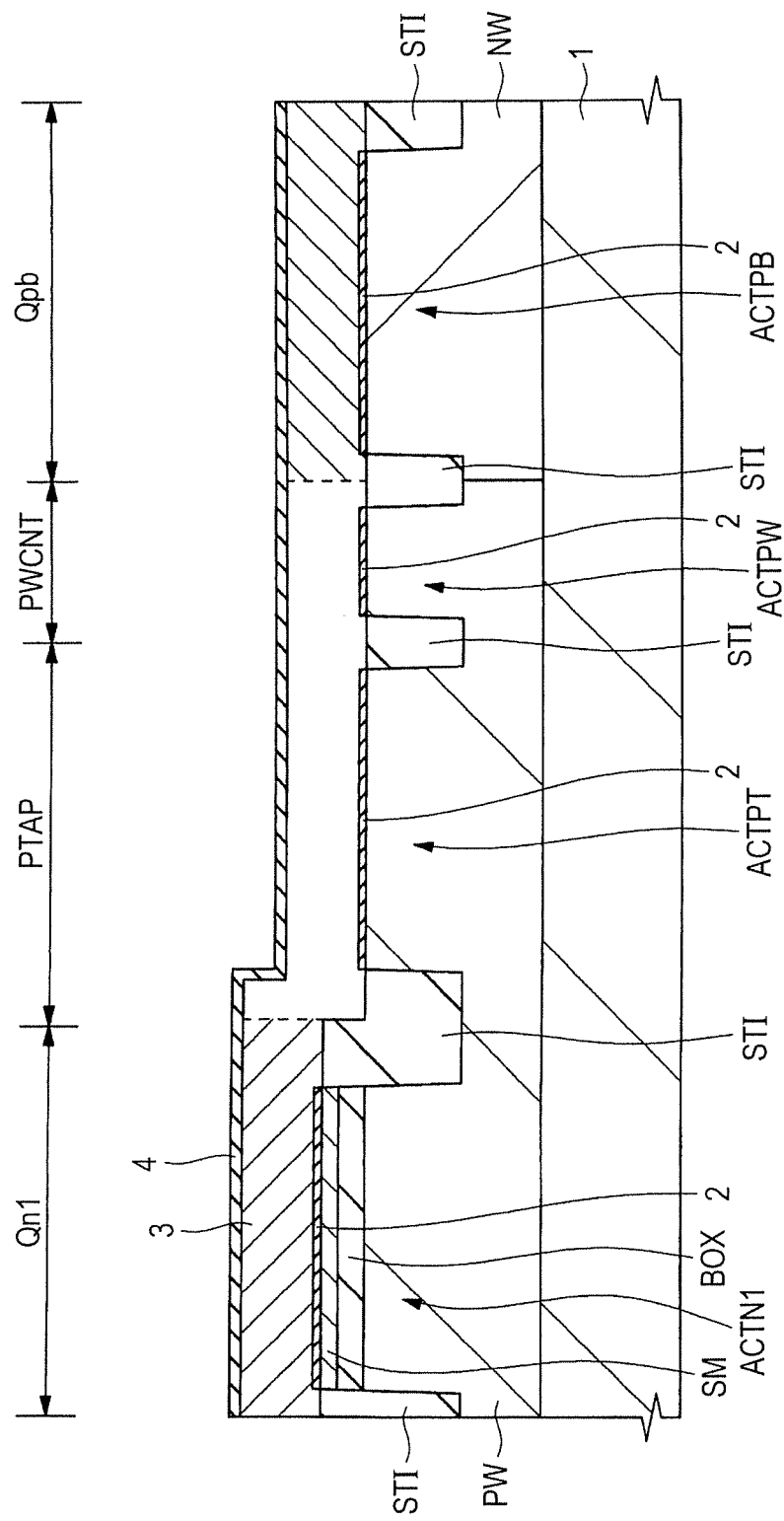
FIG. 6 is an essential part cross sectional view showing the semiconductor device in a manufacturing step in accordance with First Embodiment.

Then, as shown in FIG. 6, a step of forming a cap insulation film 4 is carried out. Over the silicon film 3, the cap insulation film 4 formed of a silicon nitride film is deposited by, for example, a low-pressure CVD method.

Figure 7:
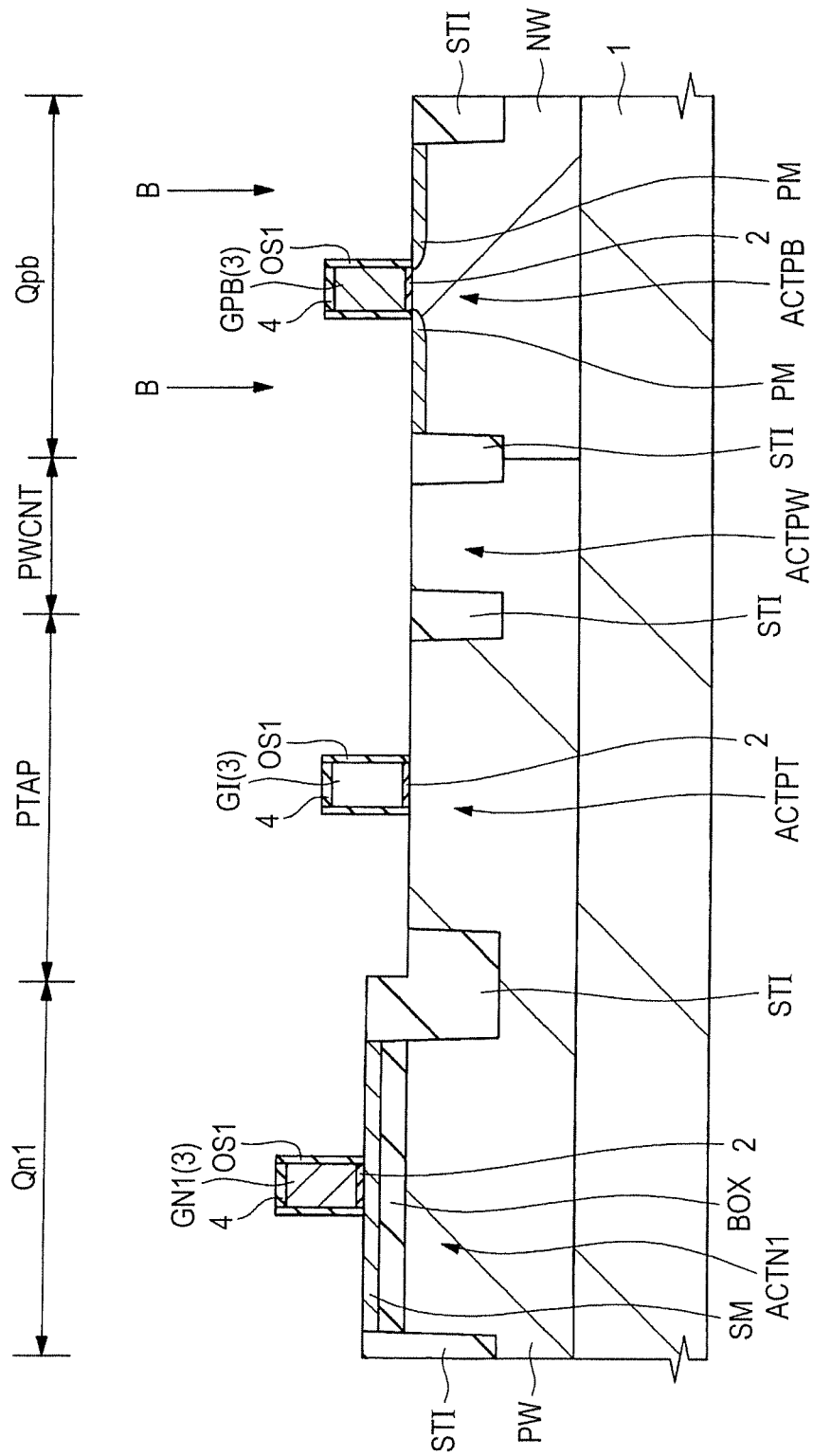
FIG. 7 is an essential part cross sectional view showing the semiconductor device in a manufacturing step in accordance with First Embodiment.

Then, as shown in FIG. 7, a gate patterning step is carried out. Using a photoresist film (not shown) as a mask, the lamination film of the silicon film 3 and the cap insulation film 4 is subjected to dry etching. As a result, a gate electrode GN1 is fanned in the formation region of the thin film n type MISFET Qn1; a non-doped region GI is formed in the formation region of the p type tap PTAP; and a gate electrode GPB is formed in the formation region of the bulk p type MISFET Qpb. The cap insulation film 4 is used as a hard mask for processing the silicon film 3 by dry etching. This can improve the processing precision of the gate electrodes GN1 and GPB, and the non-doped region GI. Specifically, the gate electrodes GN1 and GPB, and the non-doped region GI can be prevented from being rounded at the shoulders, being thinned, or the like. Further, as described later, the cap insulation film 4 has a role of inhibiting an impurity from being ion-implanted into the non-doped region GI, and a role of preventing a silicide layer from being formed at the top surface of the non-doped region GI. For this reason, it is important that the cap insulation film 4 with a sufficient film thickness is left over the gate electrode GN1, the non-doped region GI, and the gate electrode GPB after the gate patterning step.

FIG. 7 shows an example in which the gate insulation film 2 is left only under the gate electrode GN1, the non-doped region GI, and the gate electrode GPB. However, it is also acceptable that the gate insulation film 2 is also left over the semiconductor substrate 1, and over the semiconductor layer SM.

Then, as shown in FIG. 7, a step of forming an offset spacer OS1 is carried out. After the gate patterning step, a silicon nitride film is deposited over the semiconductor substrate 1. The silicon nitride film is subjected to anisotropic dry etching. As a result, the offset spacer OS1 formed of a silicon nitride film is selectively formed over the gate electrode GN1, the non-doped region GI, and the gate electrode GPB.

Further, as shown in FIG. 7, a step of forming a p type low concentration semiconductor region PM is carried out. Using a photoresist layer (not shown) exposing the bulk p type MISFET Qpb formation region, and covering other regions as a mask, a p type impurity such as boron is ion-implanted. As a result, p type low concentration semiconductor regions PM are formed in the main surface of the semiconductor substrate 1 on the opposite sides of the gate electrode GPB. The ion implantation is carried out in self-alignment with the gate electrode GPB and the offset spacer OS1. This can reduce the overlapping width of each p type low concentration semiconductor region PM with the gate electrode GPB. Further, the gate electrode GPB is covered with the cap insulation film 4. Accordingly, a p type impurity is not implanted into the gate electrode GPB.

Figure 8:
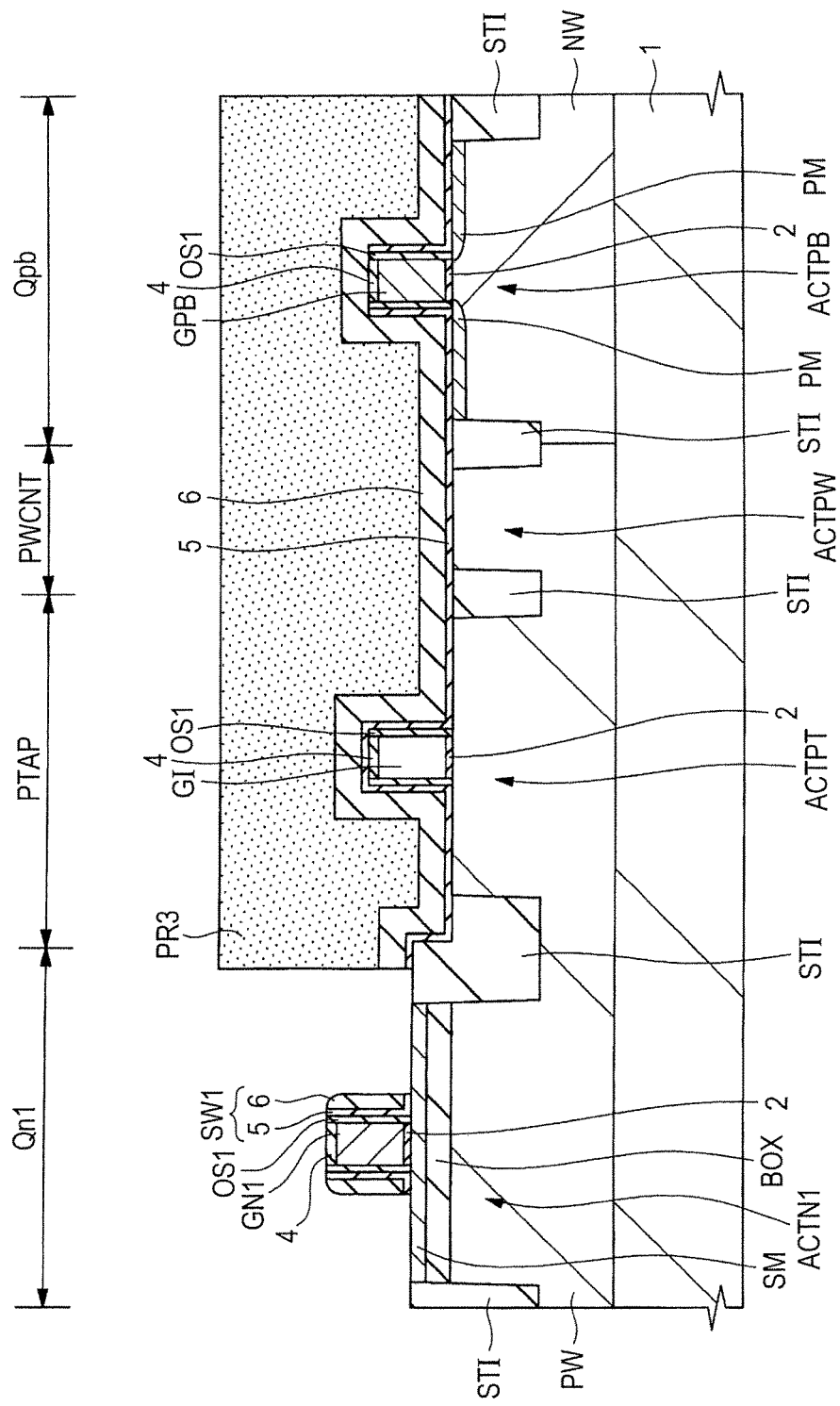
FIG. 8 is an essential part cross sectional view showing the semiconductor device in a manufacturing step in accordance with First Embodiment.

Then, as shown in FIG. 8, a step of forming a sidewall insulation film SW1 is carried out. First, over the semiconductor substrate 1, an insulation film 5 formed of a silicon oxide film, and an insulation film 6 formed of a silicon nitride film are deposited by a low-pressure CVD method or a plasma CVD method. Then, using a photoresist layer PR3 exposing the formation region of the thin film n type MISFET Qn1, and covering the formation regions of the p type tap PTAP, the p type well power feeder PWCNT, and the bulk p type MISFET Qpb as a mask, anisotropic dry etching is carried out. As a result, a sidewall insulation film SW1 formed of a lamination structure of the insulation films 5 and 6 is selectively formed over the sidewall of the gate electrode GN1 via the offset spacer OS. In other words, as shown in FIG. 8, the insulation films 5 and 6 over the gate electrode GN1, over the element isolation films STI, and over the semiconductor layer SM exposed from the gate electrode GN1 and the sidewall insulation film SW1 are removed.

Figure 9:
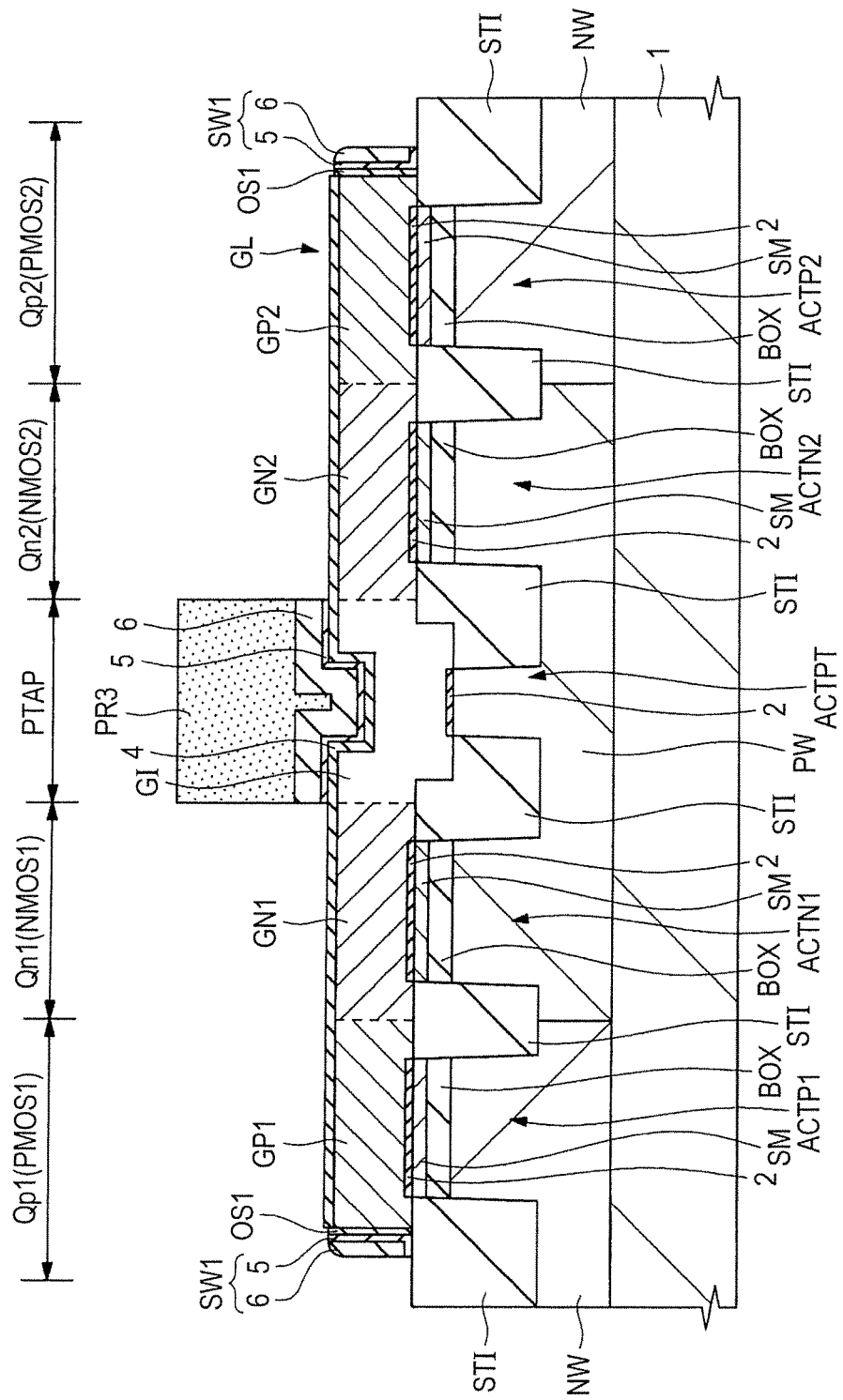
FIG. 9 is an essential part cross sectional view showing the semiconductor device in a manufacturing step in accordance with First Embodiment.

FIG. 9 shows a cross sectional view in the direction of extension of the gate electrode layer GL in the formation step of the sidewall insulation film SW1. The photoresist layer PR3 covers the formation region of the p type tap PTAP. Accordingly, the insulation films 5 and 6 in the region are left. However, the insulation films 5 and 6 over the gate electrodes GP1, GN1, GN2, and GP2 are removed, so that the cap insulation film 4 is exposed. Then, after forming a sidewall insulation film SW1, the photoresist layer PR3 is removed.

Figure 10:
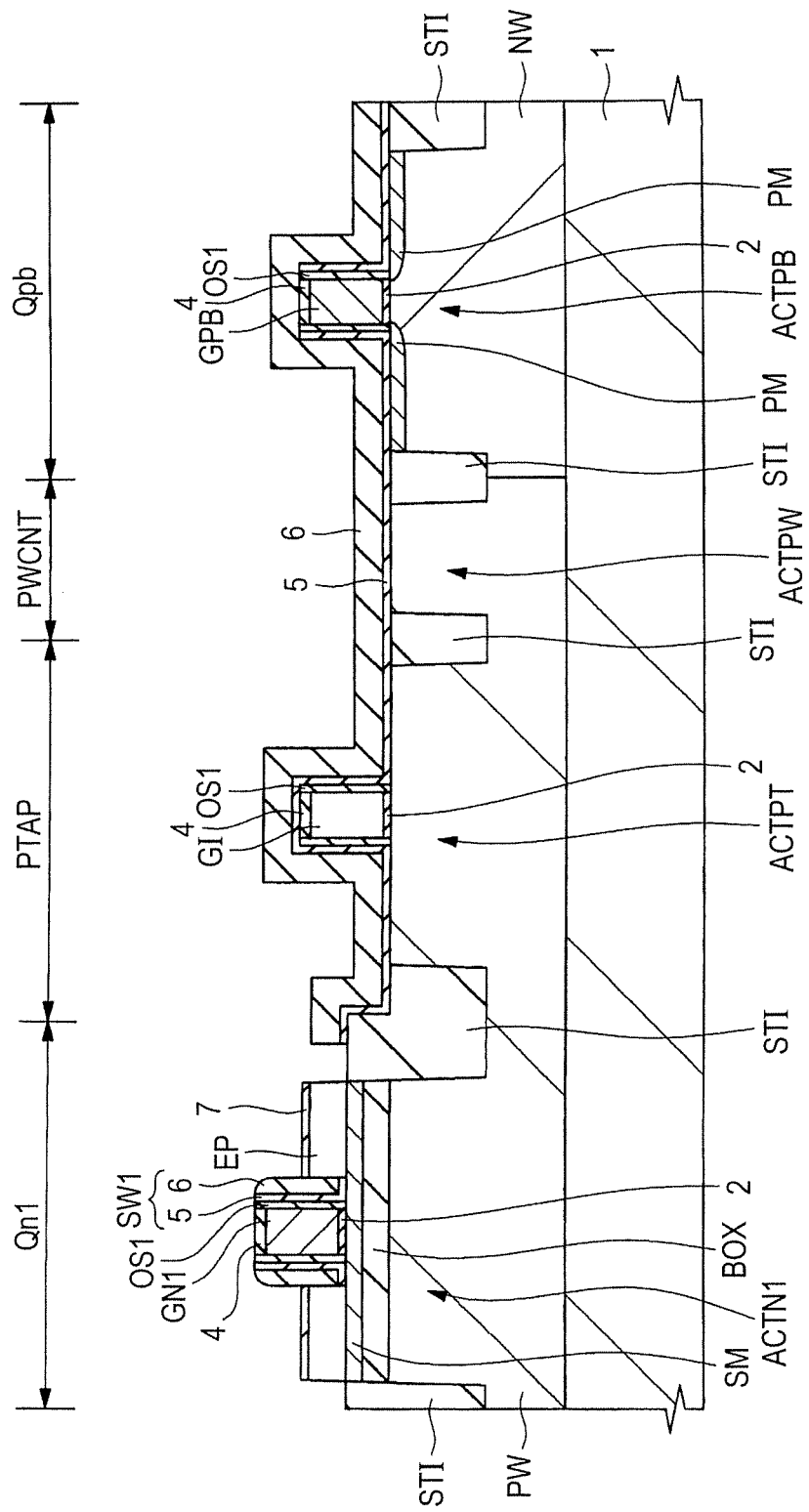
FIG. 10 is an essential part cross sectional view showing the semiconductor device in a manufacturing step in accordance with First Embodiment.

Then, as shown in FIG. 10, the formation step of an epilayer EP is carried out. In the formation region of the thin film n type MISFET Qn1, silicon is epitaxially grown at the surface of the semiconductor layer SM exposed from the gate electrode GN1, the offset spacer OS1, and the sidewall insulation film SW1, thereby to form an epilayer EP. In the epitaxial growth step, the formation regions of the p type tap PTAP, the p type well power feeder PWCNT, and the bulk p type MISFET Qpb are covered with the insulation film 6. For this reason, the epilayer EP is not formed. Then, an insulation film 7 formed of a silicon oxide film is formed at the top surface of the epilayer EP using a thermal oxidation method. The insulation film 7 functions as an etching stopper for protecting the top surface of the epilayer EP when the insulation film 6 is removed, described later.

Figure 11:
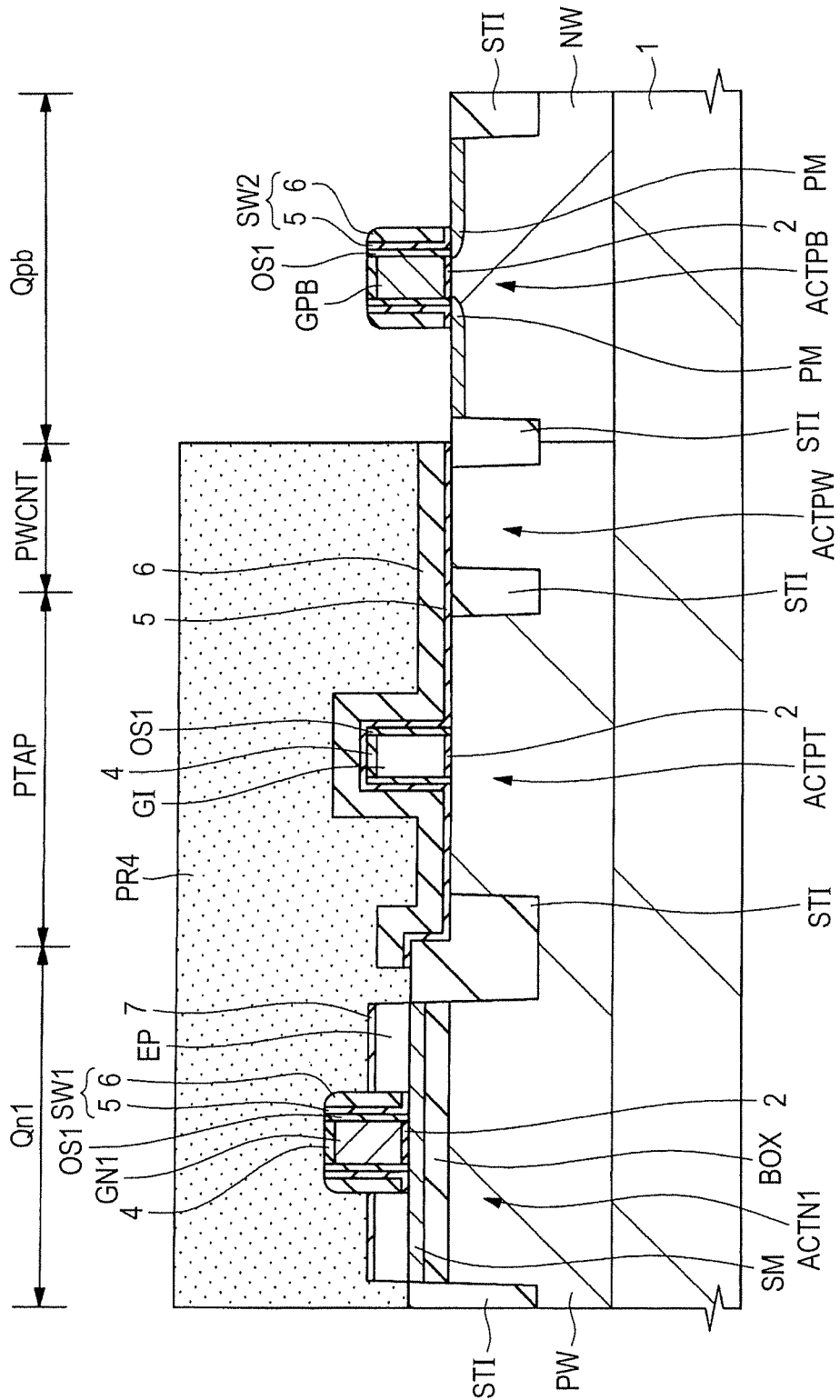
FIG. 11 is an essential part cross sectional view showing the semiconductor device in a manufacturing step in accordance with First Embodiment.

Then, as shown in FIG. 11, the formation step of a sidewall insulation film SW2 is carried out. First, a photoresist layer PR4 covering the formation regions of the thin film n type MISFET Qn1, the p type tap PTAP, and the p type well power feeder PWCNT, and exposing the formation region of the bulk p type MISFET Qpb is formed over the semiconductor substrate 1. Then, using the photoresist layer PR4 as a mask, the semiconductor substrate 1 is subjected to anisotropic dry etching. As a result, the sidewall insulation film SW2 formed of a lamination structure of the insulation films 5 and 6 is selectively formed over the sidewall of the gate electrode GPB via the offset spacer OS1. In other words, as shown in FIG. 11, the insulation films 5 and 6 over the gate electrode GPB, over the element isolation film STI, and over the semiconductor substrate 1 exposed from the gate electrode GPB and the sidewall insulation film SW2 are removed.

Figure 12:
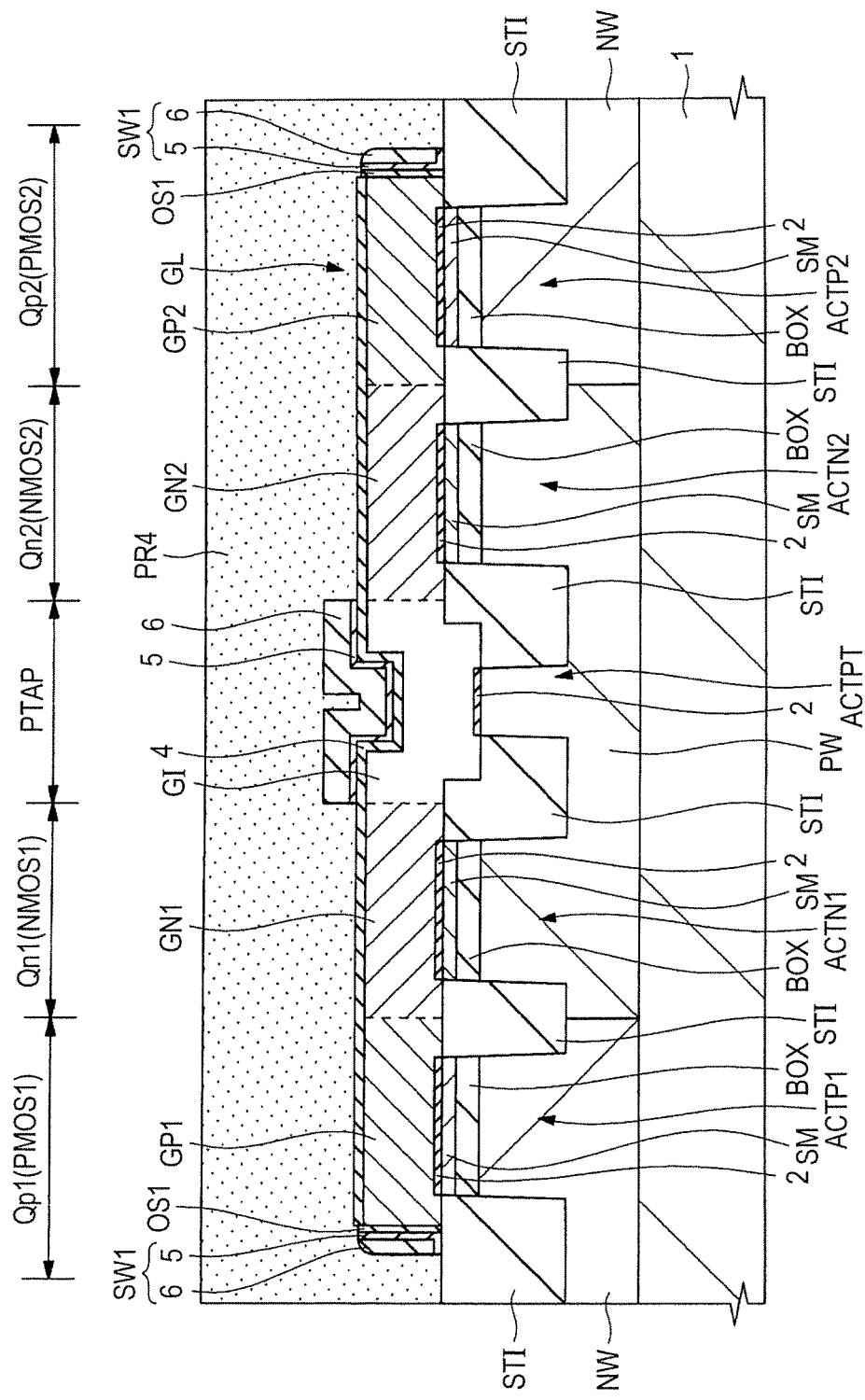
FIG. 12 is an essential part cross sectional view showing the semiconductor device in a manufacturing step in accordance with First Embodiment.

FIG. 12 shows a cross sectional view in the direction of extension of the gate electrode layer GL in the formation step of the sidewall insulation film SW2. The photoresist layer PR4 covers the formation regions of the thin film n type MISFETs Qn1 and Qn2, the thin film p type MISFETs Qp1 and Qp2, and the the p type tap PTAP. For this reason, the insulation films 5 and 6 in the formation region of the the p type tap PTAP are left without being removed. After forming a sidewall insulation film SW2, the photoresist layer PR4 is removed.

Figure 13:
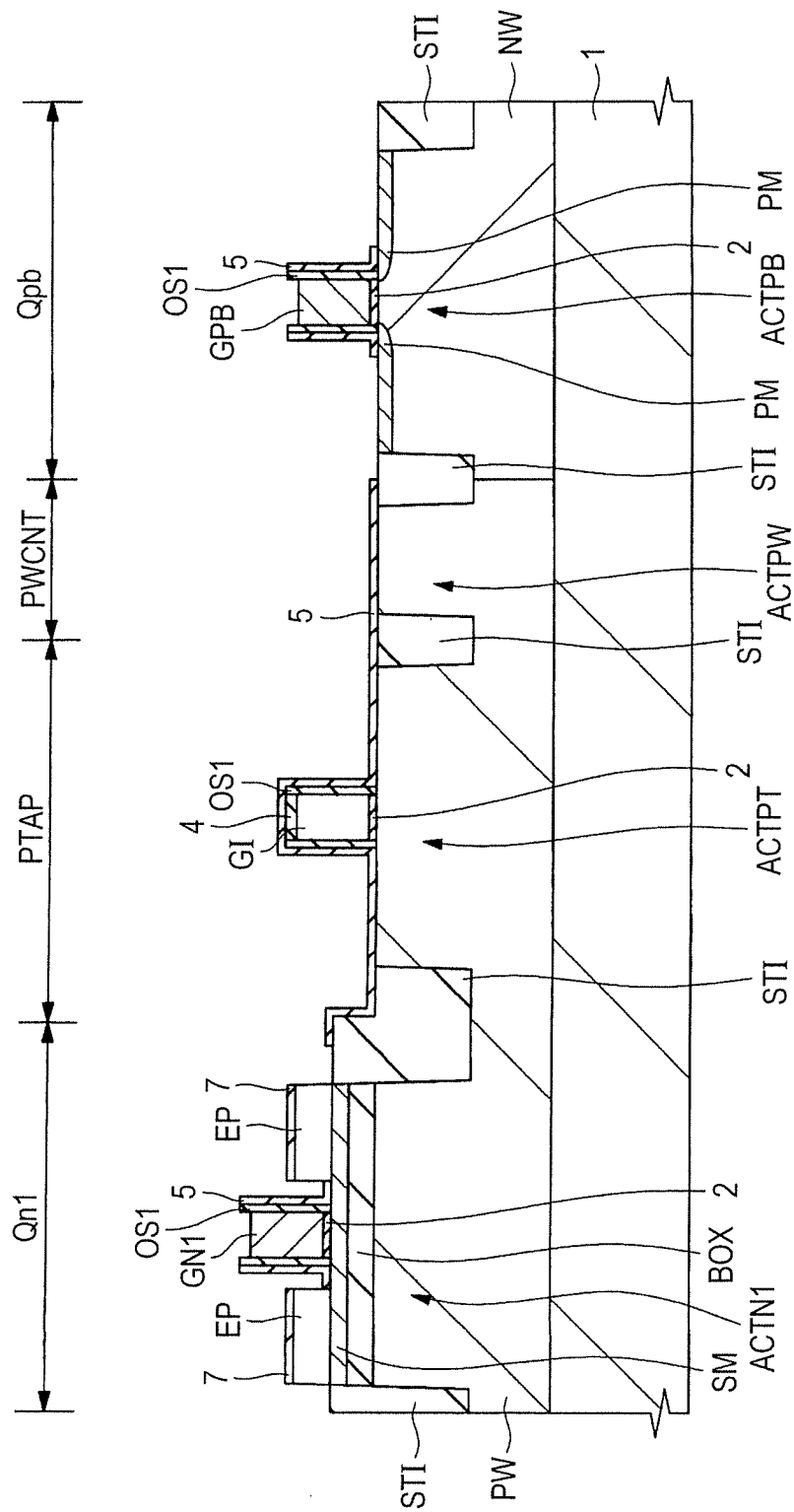
FIG. 13 is an essential part cross sectional view showing the semiconductor device in a manufacturing step in accordance with First Embodiment.

Then, the removal step of the insulation film 6 is carried out. The insulation film 6 is formed of a silicon nitride film. For this reason, for example, wet etching is carried out under the conditions capable of ensuring an etching selectivity with respect to the silicon oxide film. In other words, when the silicon nitride film is etched and removed, wet etching is carried out under the conditions in which the silicon oxide film functions as an etching stopper. The cap insulation films 4 over the gate electrodes GN1 and GPB, the insulation films 6 forming the sidewall insulation films SW1 and SW2, and the insulation film 6 in the formation regions of the p type tap PTAP and the p type well power feeder PWCNT shown in FIG. 11 are removed. Then, as shown in FIG. 13, the top surfaces of the gate electrodes GN1 and GPB are exposed. Further, each insulation film 5 formed of a silicon oxide film forming the sidewall insulation films SW1 and SW2 is exposed. Further, the insulation film 5 formed of a silicon oxide film in the formation region of the p type well power feeder PWCNT is exposed.

Figure 14:
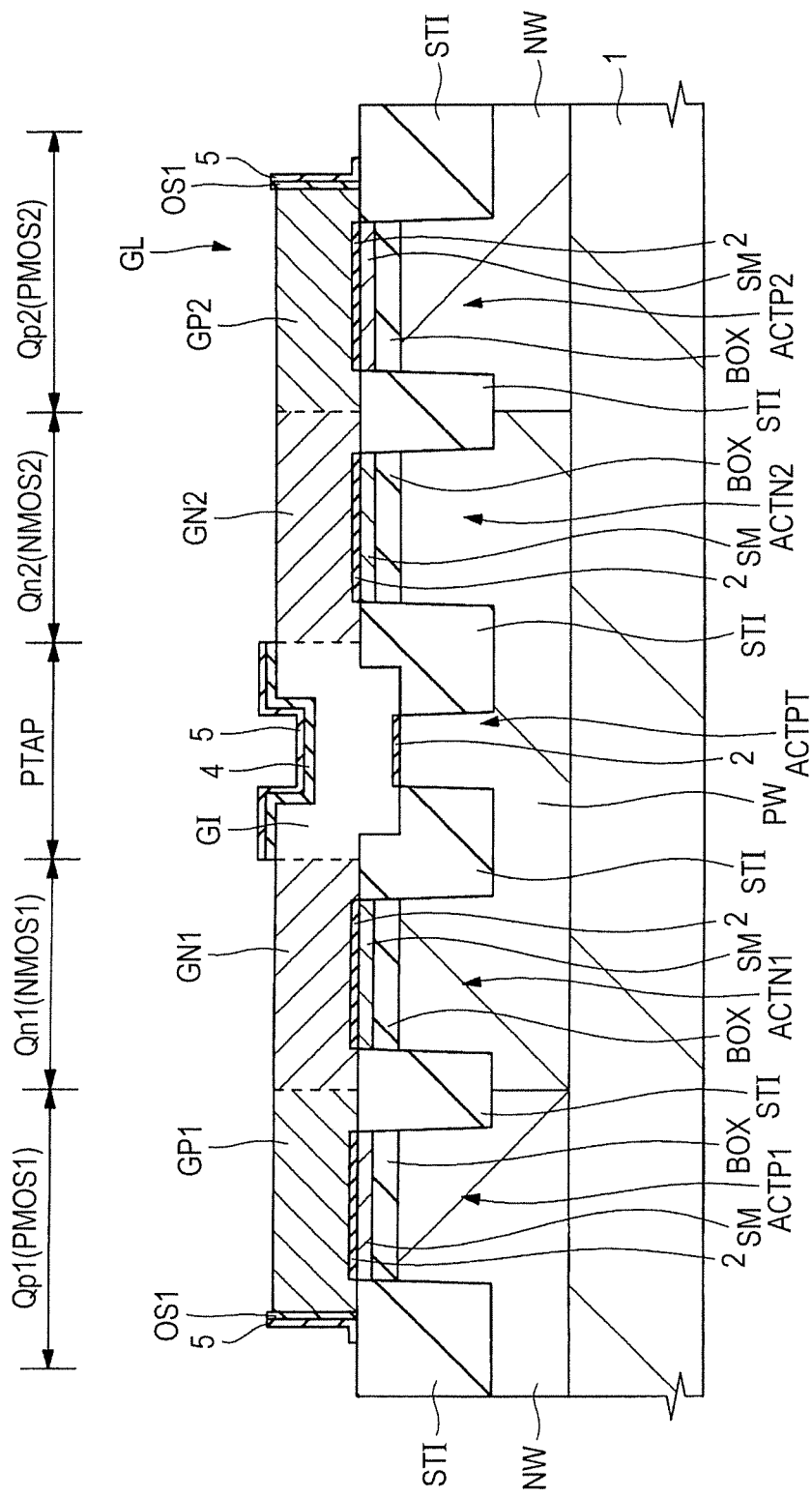
FIG. 14 is an essential part cross sectional view showing the semiconductor device in a manufacturing step in accordance with First Embodiment.

FIG. 14 shows a cross sectional view in the direction of extension of the gate electrode layer GL in the removal step of the insulation film 6. The cap insulation films 4 over the gate electrodes GP1, GN1, GN2, and GP2, and the insulation film 6 forming the sidewall insulation film SW1 shown in FIG. 12 are removed. In the formation region of the p type tap PTAP, the insulation film 6 is removed. However, the insulation film 5, and the cap insulation film 4 covered with the insulation film 5 are left.

Figure 15:
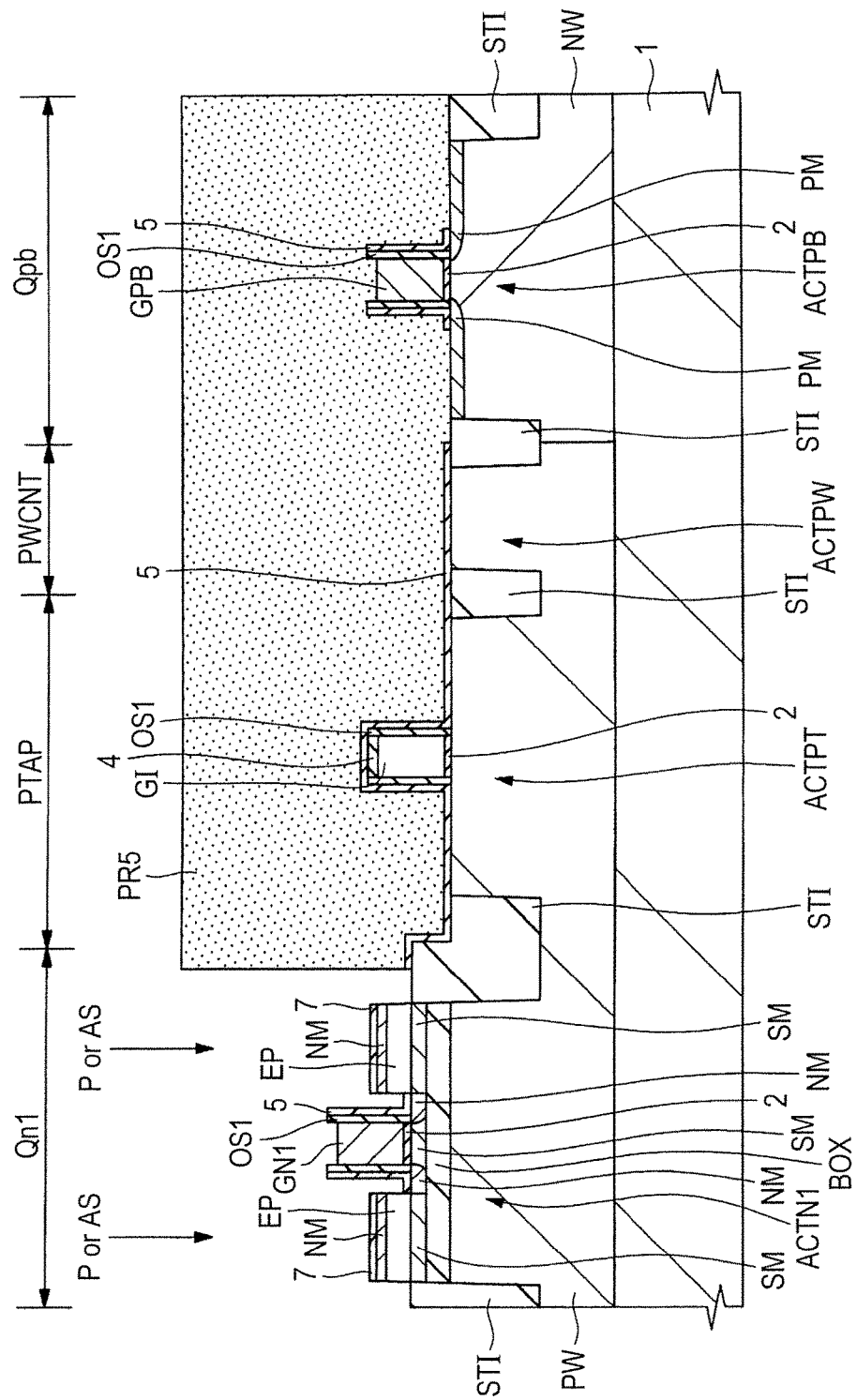
FIG. 15 is an essential part cross sectional view showing the semiconductor device in a manufacturing step in accordance with First Embodiment.

Then, as shown in FIG. 15, the formation step of the n type low concentration semiconductor region NM is carried out. First, a photoresist layer PR5 covering the formation regions of the p type tap PTAP, the p type well power feeder PWCNT, and the bulk p type MISFET Qpb, and exposing the formation region of the thin film n type MISFET Qn1 is formed. Using the photoresist layer PR5 as a mask, an ion implantation step is carried out. In the ion implantation step, an n type impurity such as phosphorus (P) or arsenic (As) is ion-implanted, thereby to from n type low concentration semiconductor regions NM of the thin film n type MISFET Qn1 at the surface of the epilayer EP, and the surface of the semiconductor layer SM between the gate electrode GN1 and the epilayer EP. At this step, the gate electrode GN1 is also doped with an n type impurity.

Figure 16:
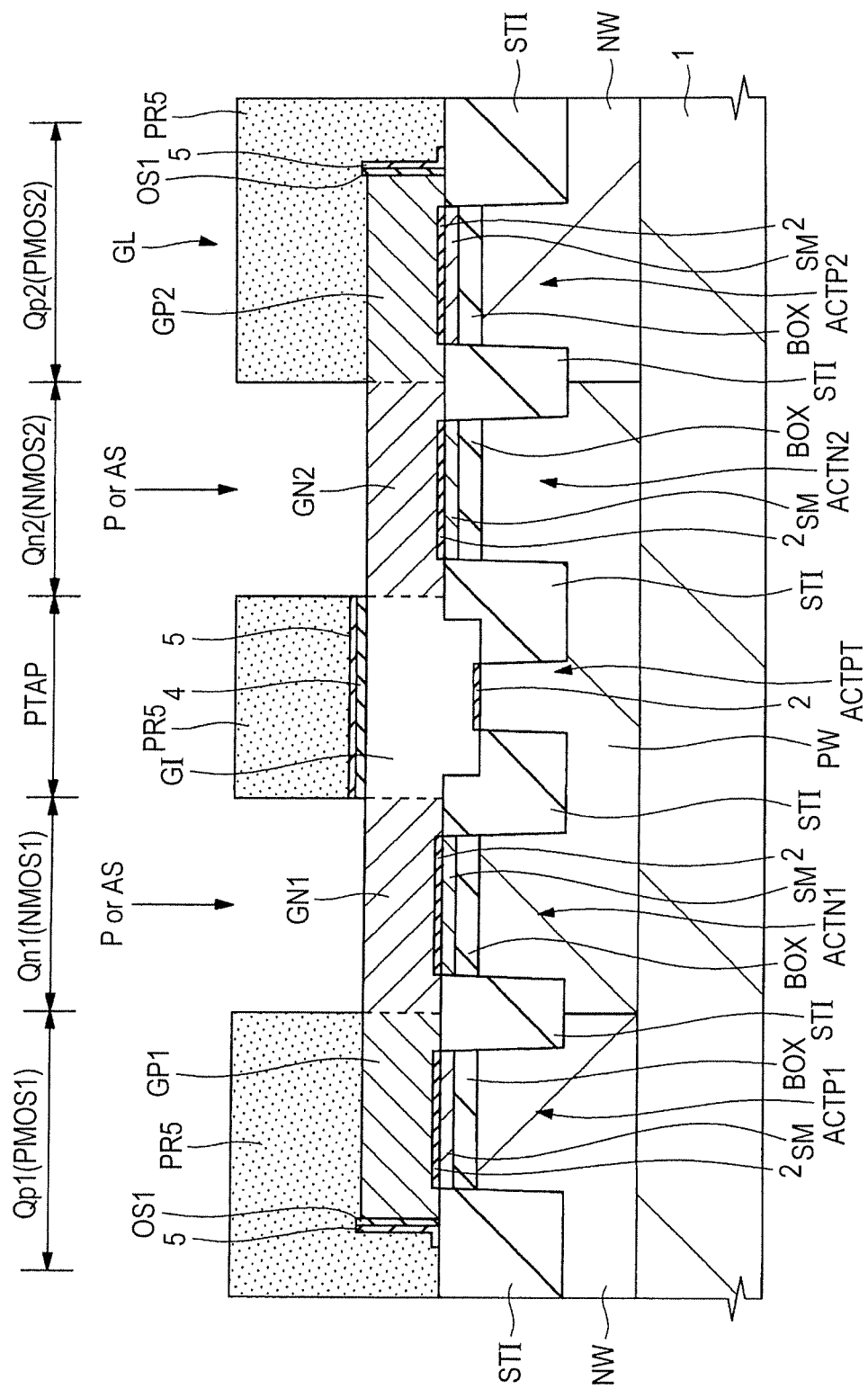
FIG. 16 is an essential part cross sectional view showing the semiconductor device in a manufacturing step in accordance with First Embodiment.

FIG. 16 shows a cross sectional view in the direction of extension of the gate electrode layer GL in the formation step of the n type low concentration semiconductor regions NM. The photoresist layer PR5 exposes the formation regions of the thin film n type MISFETs Qn1 and Qn2. For this reason, an n type impurity is ion-implanted into the gate electrodes GN1 and GN2. On the other hand, the formation regions of the thin film p type MISFETs Qp1 and Qp2, and the formation region of the the p type tap PTAP are covered with the photoresist layer PR5. For this reason, an n type impurity is not ion-implanted into the gate electrodes GP1 and GP2, and the non-doped region GI.

Similarly, when the p type low concentration semiconductor regions of the thin film p type MISFETs Qp1 and Qp2 are formed, a photoresist layer (not shown) exposing the formation regions of the thin film p type MISFETs Qp1 and Qp2, and the formation region of the the p type tap PTAP, and covering the formation regions of the thin film n type MISFETs Qn1 and Qn2 is used as an ion implantation mask for a p type impurity (e.g., boron (B)). Therefore, the p type impurity is implanted into the gate electrodes GP1 and GP2, and is not implanted into the gate electrodes GN1 and GN2 covered with the the photoresist layer. The non-doped region GI is not covered with the photoresist layer, but is covered with the cap insulation film 4, and hence is not doped with the p type impurity. Incidentally, after the ion implantation of a p type impurity and an n type impurity, the semiconductor substrate 1 is subjected to a heat treatment for activating the implanted impurities.

Figure 17:
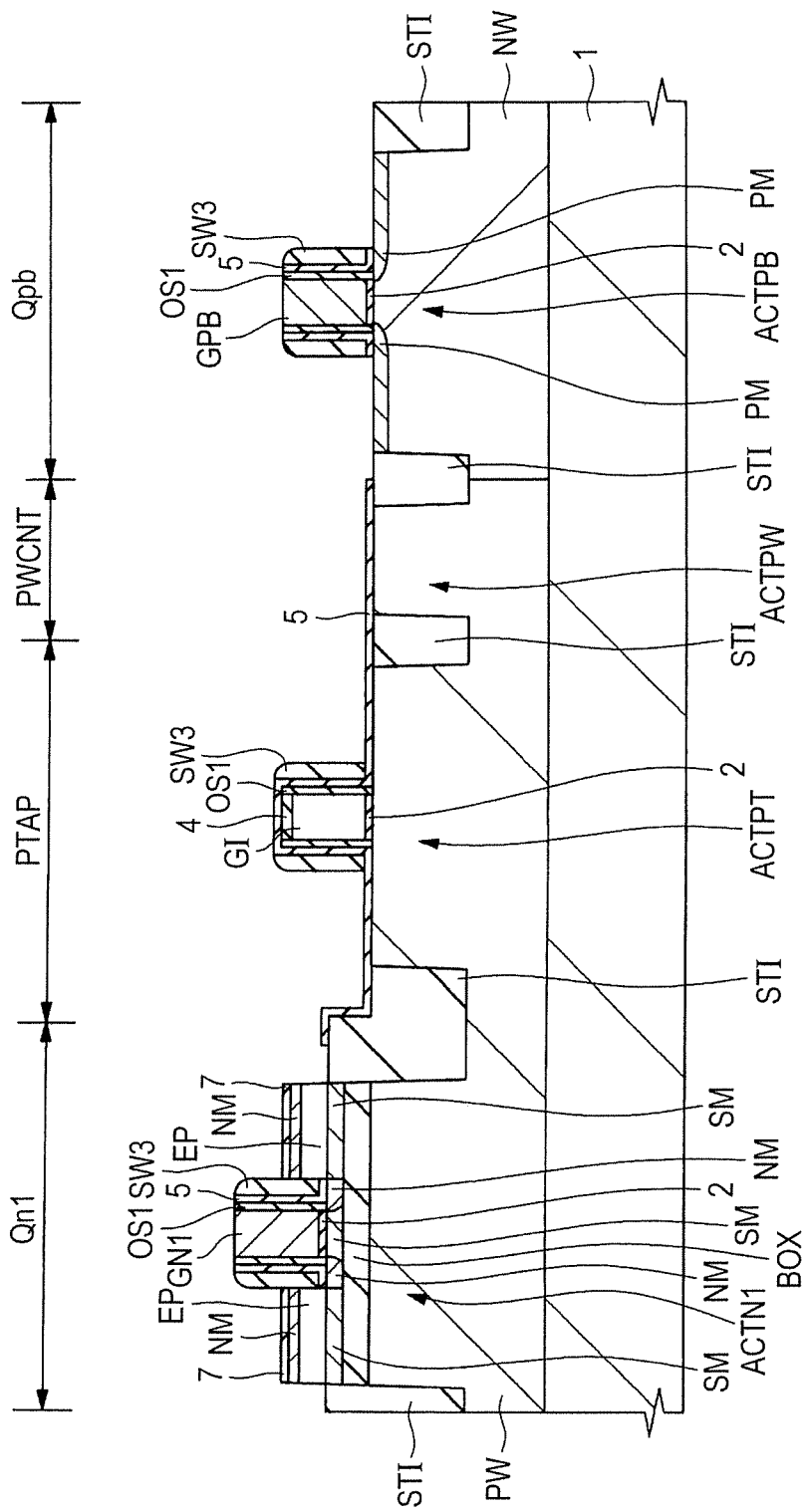
FIG. 17 is an essential part cross sectional view showing the semiconductor device in a manufacturing step in accordance with First Embodiment.

Then, as shown in FIG. 17, the formation step of the sidewall insulation film SW3 is carried out. First, over the semiconductor substrate 1, an insulation film formed of a silicon nitride film is deposited by a low-pressure CVD method or a plasma CVD method. Then, anisotropic dry etching is carried out, thereby to form sidewall insulation films SW3. The sidewall insulation films SW3 are formed over the sidewalls of the gate electrodes GN1 and GPB, and the non-doped region GI via the offset spacers OS1 and the insulation films 5, respectively. After carrying out anisotropic dry etching, the insulation film formed of a silicon nitride film is not left over the gate electrodes GN1 and GPB, and over the non-doped region GI. In other words, the top surfaces of the gate electrodes GN1 and GPB are exposed, and the insulation film 5 is exposed over the non-doped region GI. The cap insulation film 4 formed of a silicon nitride film situated over the non-doped region GI is covered with the insulation film 5 formed of a silicon oxide film. Therefore, even when overetching is performed in anisotropic dry etching for forming the sidewall insulation film SW3, the insulation film 5 formed of a silicon oxide film functions as an etching stopper. For this reason, the cap insulation film 4 formed of a silicon nitride film can be prevented from being etched, and being thinned or being eliminated.

Figure 18:
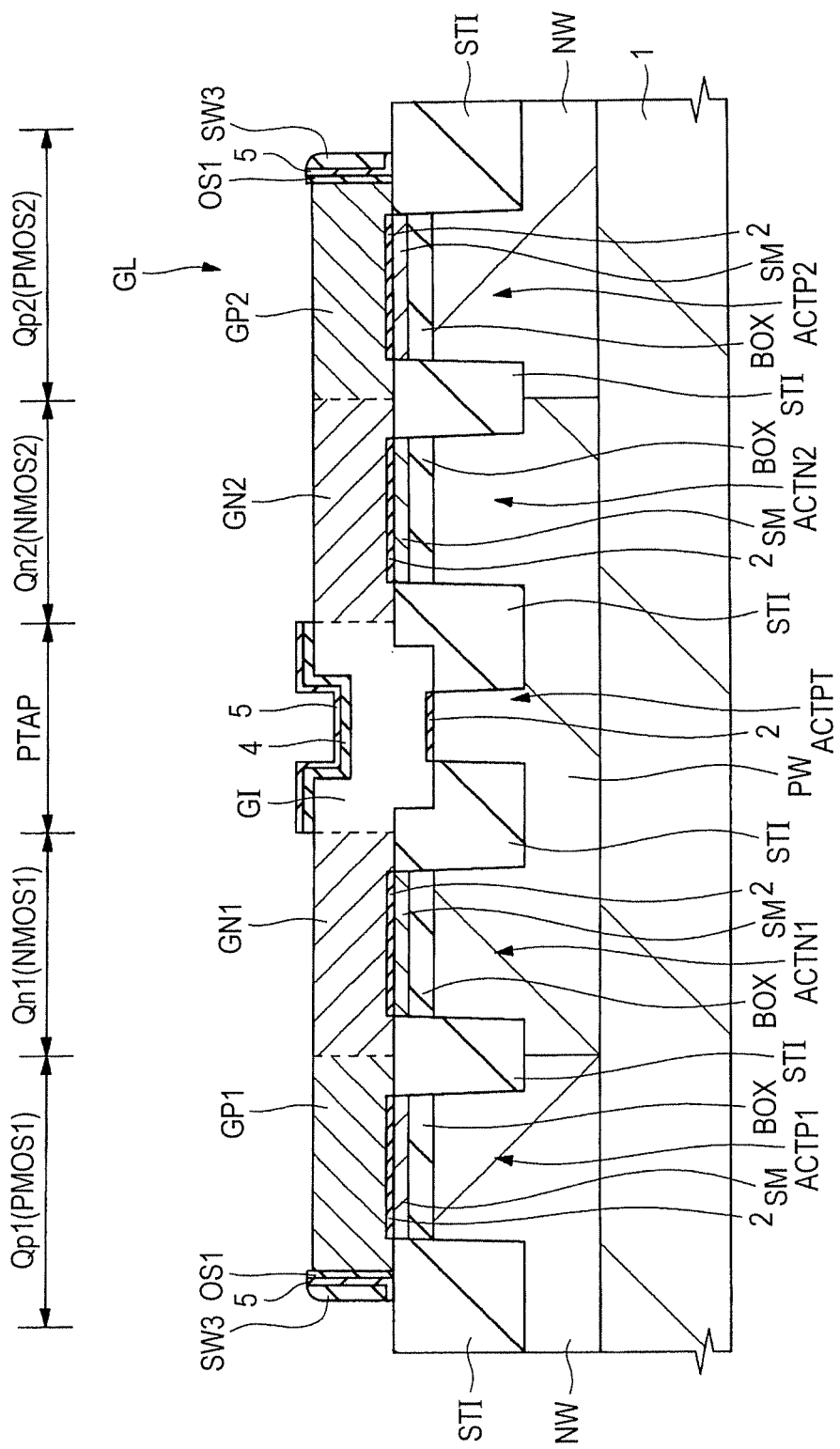
FIG. 18 is an essential part cross sectional view showing the semiconductor device in a manufacturing step in accordance with First Embodiment.

FIG. 18 shows a cross sectional view in the direction of extension of the gate electrode layer GL in the formation step of the sidewall insulation film SW3. A sidewall insulation film SW3 is formed at each end of the direction of extension of the gate electrode layer GL via the offset spacer OS1 and the insulation film 5. The gate electrodes GP1, GN1, GN2, and GP2 are exposed, and the non-doped region GI is covered with the insulation films 4 and 5.

Figure 19:
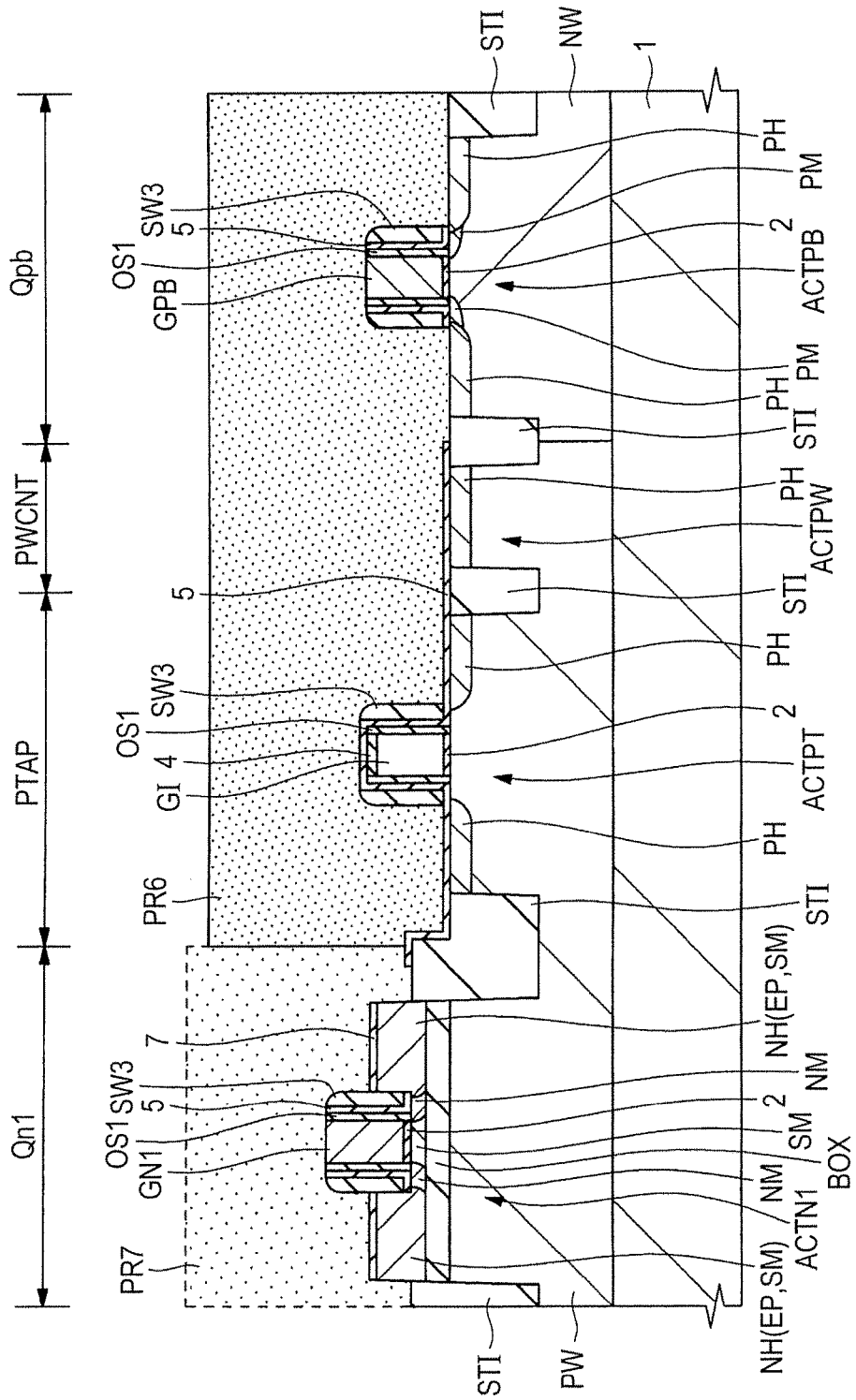
FIG. 19 is an essential part cross sectional view showing the semiconductor device in a manufacturing step in accordance with First Embodiment.

Then, as shown in FIG. 19, the formation step of the n type high concentration semiconductor region NH is carried out. First, a photoresist layer PR6 covering the formation regions of the p type tap PTAP, the p type well power feeder PWCNT, and the bulk p type MISFET Qpb, and exposing the formation region of the thin film n type MISFET Qn1 is formed. Using the photoresist layer PR6 as a mask, an ion implantation step is carried out. In the ion implantation step, an n type impurity such as phosphorus (P) or arsenic (As) is ion-implanted, thereby to form the n type high concentration semiconductor regions NH at the epilayer EP, and the semiconductor layer SM. At this step, the gate electrode GN1 is also doped with an n type impurity. The gate electrode GPB and the non-doped region GI covered with the photoresist layer PR6 are not doped with an n type impurity. Upon completion of the ion implantation step, the photoresist layer PR6 is removed.

Then, as shown in FIG. 19, the formation step of a p type high concentration semiconductor region PH is carried out. A photoresist layer PR7 exposing the formation regions of the p type tap PTAP, the p type well power feeder PWCNT, and the bulk p type MISFET Qpb, and covering the formation region of the thin film n type MISFET Qn1 is formed. Using the photoresist layer PR7 as a mask, an ion implantation step is carried out. In the ion implantation step, a p type impurity such as boron (B) is ion-implanted, thereby to form p type high concentration semiconductor regions PH in the formation regions of the p type tap PTAP, the p type well power feeder PWCNT, and the bulk p type MISFET Qpb.

In the formation region of the bulk p type MISFET Qpb, the p type high concentration semiconductor regions PH are formed in the main surface of the semiconductor substrate 1 (n type well layer NW) at the opposite ends of the gate electrode GPB. The p type impurity is also implanted into the gate electrode GPB. In the formation region of the p type tap PTAP, the p type high concentration semiconductor regions PH are formed at the main surface of the semiconductor substrate 1 (p type well layer PW) at the opposite ends of the non-doped region GI. The top surface of the non-doped region GI is covered with the cap insulation film 4 formed of a silicon nitride film. For this reason, when the p type high concentration semiconductor regions PH are formed, the p type impurity can be prevented from being implanted into the non-doped region GI. Whereas, in the formation region of the the p type well power feeder PWCNT, the p type high concentration semiconductor regions PH are also formed at the main surface of the semiconductor substrate 1 (p type well layer PW). Incidentally, the p type high concentration semiconductor regions PH of the thin film p type MISFETs Qp1 and Qp2 are formed simultaneously with the formation step of the p type high concentration semiconductor regions PH of the bulk p type MISFET Qpb.

Figure 20:
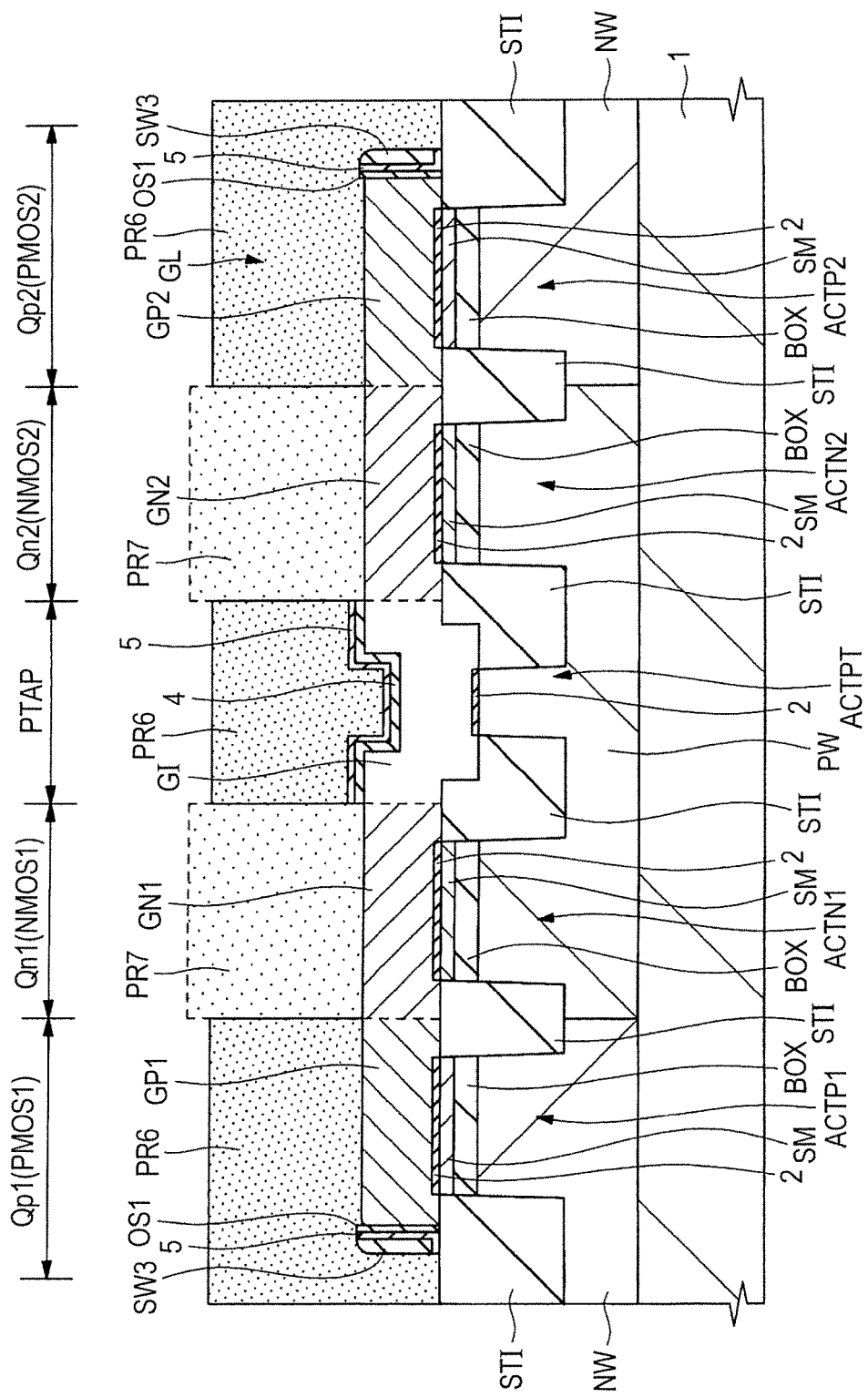
FIG. 20 is an essential part cross sectional view showing the semiconductor device in a manufacturing step in accordance with First Embodiment.

FIG. 20 shows a cross sectional view in the direction of extension of the gate electrode layer GL in the formation step of the n type high concentration semiconductor regions NH and the p type high concentration semiconductor regions PH. The photoresist layer PR6 for forming the n type high concentration semiconductor regions NH exposes the formation regions of the thin film n type MISFETs Qn1 and Qn2. For this reason, an n type impurity is ion-implanted into the gate electrodes GN1 and GN2. On the other hand, the formation regions of the thin film p type MISFETs Qp1 and Qp2, and the formation region of the p type tap PTAP are covered with the photoresist layer PR6. For this reason, an n type impurity is not ion-implanted into the gate electrodes GP1 and GP2, and the non-doped region GI.

The photoresist layer PR7 for forming the p type high concentration semiconductor regions PH covers the formation regions of the thin film n type MISFETs Qn1 and Qn2. For this reason, the p type impurity is not ion-implanted into the gate electrodes GN1 and GN2. On the other hand, the formation regions of the thin film p type MISFETs Qp1 and Qp2 are not covered with the photoresist layer PR7. For this reason, the p type impurity is ion-implanted into the gate electrodes GP1 and GP2. The non-doped region GI is not covered with the photoresist layer PR7, but is covered with the cap insulation film 4, and hence is not ion-implanted with the p type impurity. Incidentally, after the ion implantation of the p type impurity and the n type impurity, the semiconductor substrate 1 is subjected to a heat treatment for activating the implanted impurities.

Figure 21:
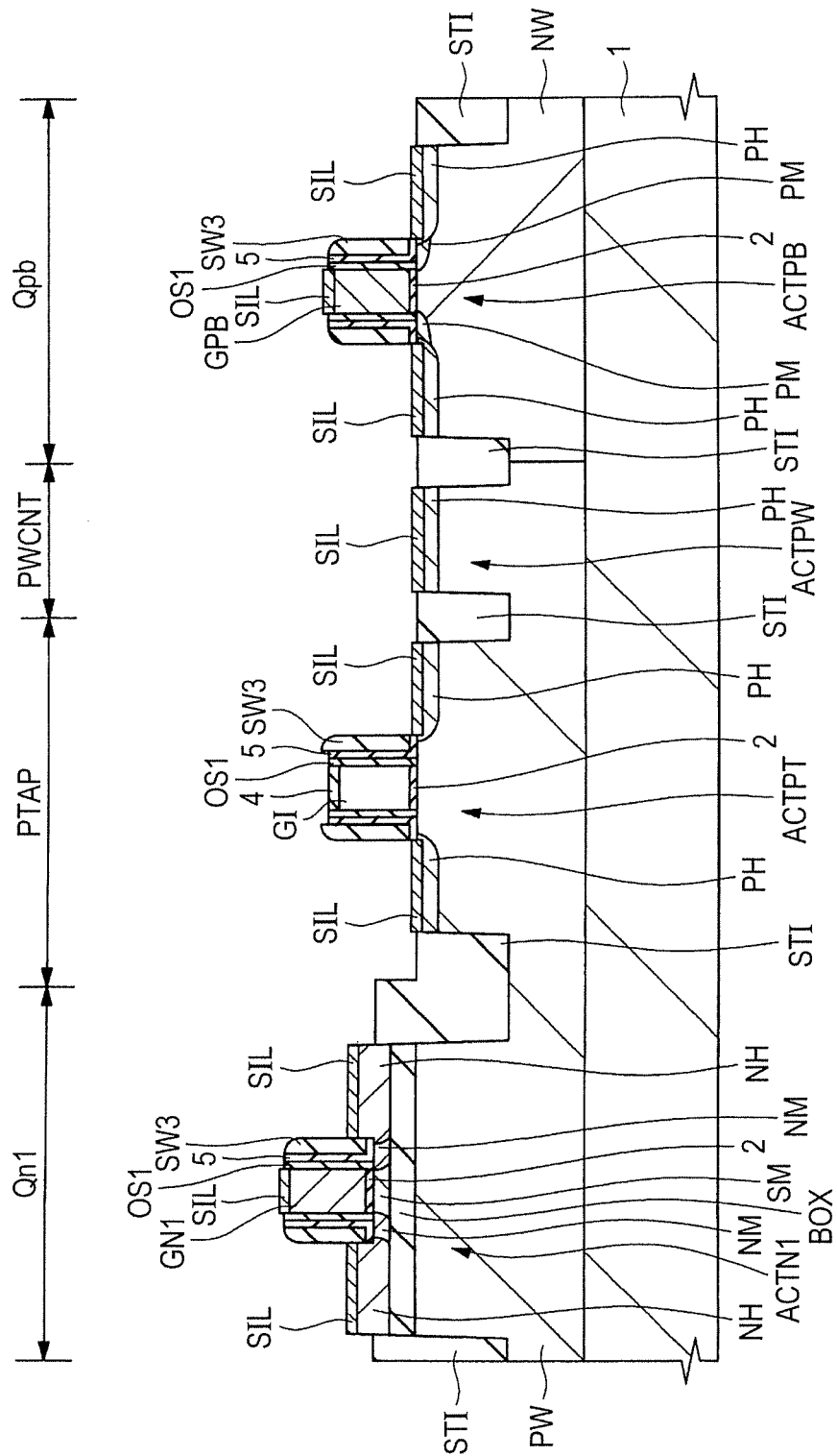
FIG. 21 is an essential part cross sectional view showing the semiconductor device in a manufacturing step in accordance with First Embodiment.

Then, as shown in FIG. 21, the formation step of the silicide layer SIL is carried out. First, the silicon oxide film exposed at the main surface of the semiconductor substrate 1 is removed. In other words, the insulation film 7 at the surface of each n type high concentration semiconductor region NH, the insulation film 5 over each p type high concentration semiconductor region PH, and the insulation film 5 over the non-doped region GI, shown in FIG. 19 are removed by wet etching. The top surface of the non-doped region GI is covered with the cap insulation film 4 formed of a silicon nitride film. For this reason, even after the removal of the insulation film 5, the top surface of the non-doped region GI is not exposed.

Then, silicide layers SIL are formed at the exposed surfaces of the high concentration semiconductor regions NH and the p type high concentration semiconductor regions PH, and the surfaces of the gate electrodes GN1 and GPB. The silicide layer SIL is formed of, for example, a cobalt silicide (CoSi) layer, a titanium silicide (TiSi) layer, a nickel silicide (NiSi) layer, or a platinum (Pt)-containing nickel silicide (NiSi) layer. However, the top surface of the non-doped region GI is covered with the cap insulation film 4. For this reason, the silicide layer SIL is not formed thereover.

Figure 22:
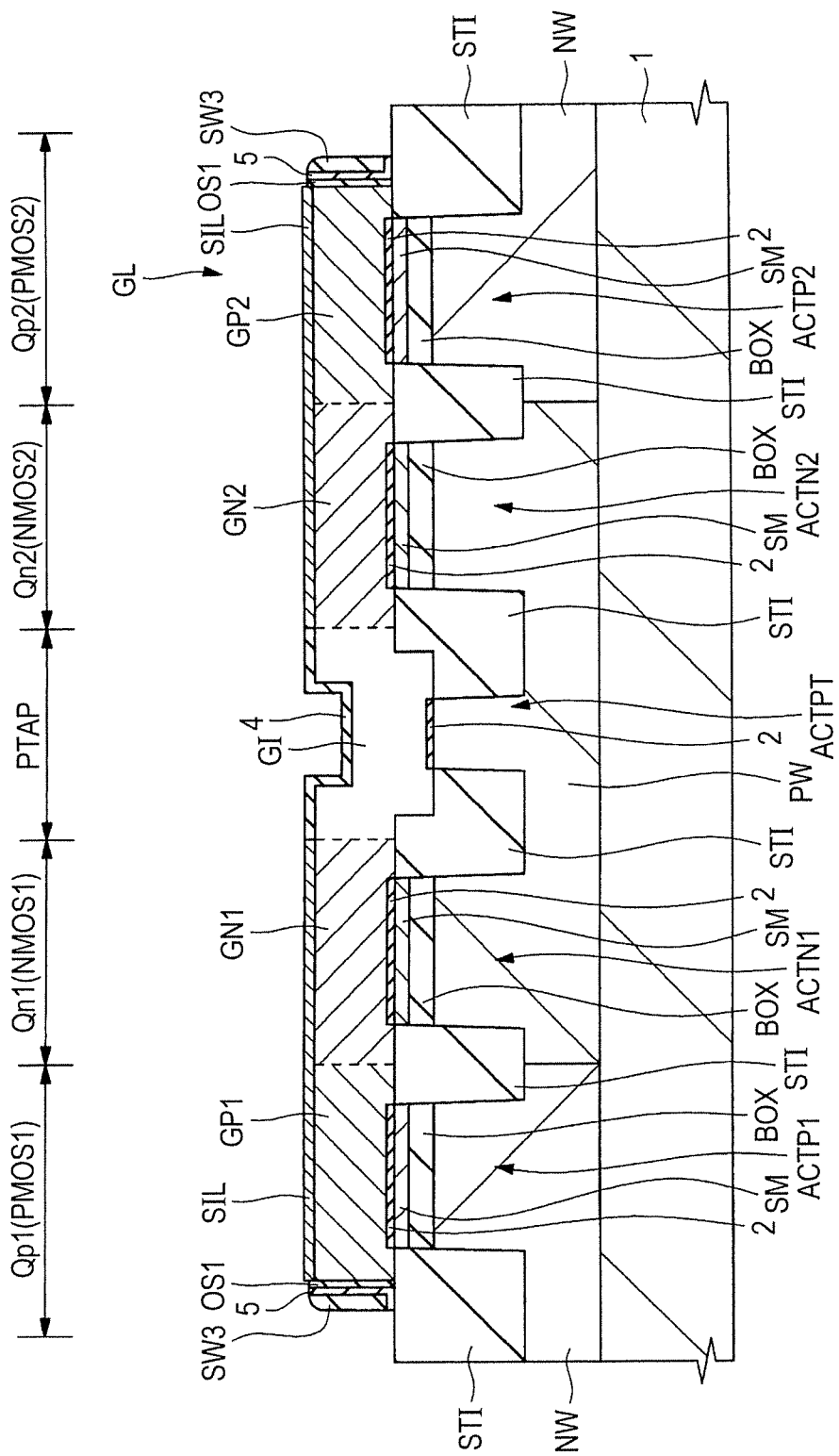
FIG. 22 is an essential part cross sectional view showing the semiconductor device in a manufacturing step in accordance with First Embodiment.

FIG. 22 shows a cross sectional view in the direction of extension of the gate electrode layer GL in the formation step of the silicide layer SIL. A silicide layer SIL is continuously formed at the top surfaces of the gate electrodes GP1 and GN1 arranged adjacent to each other. Similarly, a silicide layer SIL is continuously formed at the top surfaces of the gate electrodes GP2 and GN2 arranged adjacent to each other. However, the top surface of the non-doped region GI is covered with the cap insulation film 4, and a silicide layer SIL is not formed thereover. In other words, the silicide layer SIL over the gate electrodes GP1 and GN1, and the silicide layer SIL over the gate electrodes GP2 and GN2 are isolated from each other by the cap insulation film 4, and can be electrically independent of each other. Incidentally, before the formation of the silicide layer SIL, an insulation film such as a silicon oxide film may be selectively formed over the non-doped region GI. In this case, the formation of a silicide layer SIL can be prevented with more reliability than in the case of only the cap insulation film 4.

Then, as shown in FIGS. 2 and 3, the formation step of the plug electrodes PG is carried out. First, an interlayer insulation film IL having a plurality of openings is formed over the semiconductor substrate 1. The interlayer insulation film IL is formed of an insulation film (inorganic insulation film) such as a silicon oxide film, a silicon nitride film, or a lamination film of a silicon nitride film and a silicon oxide film formed over the silicon nitride film. The silicon oxide film and the silicon nitride film are deposited over the semiconductor substrate 1 using a low-pressure CVD method or a plasma CVD method. The openings of the interlayer insulation film IL expose a part of the top surface (surface) of each silicide layers SIL formed at the surfaces of the n type high concentration semiconductor regions NH, the p type high concentration semiconductor regions PH, and the gate electrodes GN1, GP1, GN2, and GP2. Then, a plug electrode PG formed of a metal film is formed in each opening of the interlayer insulation film IL. The plug electrode PG is of a lamination structure of a barrier film such as a tungsten nitride (TiW) film or a titanium nitride (TiN) film, and tungsten (W). The barrier film is formed at the surface of the silicide layer SIL and the sidewall of the opening, and a tungsten film is formed over the barrier film.

Then, the formation step of a metal wire MW, a power supply potential wire VDD, and a reference potential wire VSS is carried out. The metal wire MW having a desired pattern, the power supply potential wire VDD, and the reference potential wire VSS are formed over the interlayer insulation film IL in such a manner as to be in contact with the plug electrode PG. The metal wire MW, the power supply potential wire VDD, and the reference potential wire VSS are each a metal film mainly including an aluminum (Al) film or a copper (Cu) film, and may contain a trace amount of impurity. Examples thereof also include an aluminum film containing copper or silicon, or a copper film containing palladium.

As described up to this point, the gate electrodes GP1, GN1, GN2, GP2, and GPB each become a polycrystal silicon film for the following reason: a p type impurity or an n type impurity is implanted into the silicon film 3 formed of an amorphous silicon film; then, a heat treatment is performed thereon during the formation step of the p type or n type low concentration semiconductor regions PM or NM, or the p type or n type high concentration semiconductor regions PH or NH. On the other hand, the non-doped region GI is not doped with the p type impurity or n type impurity, and hence remains still an amorphous silicon film.

<Features of a Semiconductor Device and a Manufacturing Method Thereof>

In accordance with the present First Embodiment, the following features can be produced.

First, the height of the circuit cell can be reduced to implement the size reduction of the semiconductor device. Herein, the height of the circuit cell will be described by reference to FIG. 1. The height of the circuit cell is defined as the distance between the center of the power supply potential wire VDD and the center of the reference potential wire VSS in the Y direction.

FIG. 23 is a study example of First Embodiment, and is a plan view of the circuit cell corresponding to the first circuit cell of FIG. 1, showing one thin film p type MISFET Qp1, and one thin film n type MISFET Qn1. The active region ACTP1 in which the thin film p type MISFET Qp1 is formed, and the active region ACTN1 in which the thin film n type MISFET Qn1 is formed extend in parallel with each other in the X direction. Then, a gate electrode layer GL3 partially serving as the gate electrodes GP1 and GN1 extends and is arranged in the Y direction in such a manner as to cross with the active regions ACTP1 and ACTN1. As distinct from the circuit cell 1 of FIG. 1, the gate electrode layer GL3 terminates inside the circuit cell. In other words, the gate electrode layer GL3 does not cross with the power supply potential wire VDD (or, the active region ACTNT) and the reference potential wire VSS (or, the active region ACTPT). The gate electrode layer GL3 terminates in the region inside the power supply potential wire VDD (or the active region ACTNT) and the reference potential wire VSS (or the active region ACTPT). Further, in FIG. 23, a sidewall insulation film SW4 is shown around the gate electrode layer GL3. The sidewall insulation film SW4 corresponds to the offset spacer OS1, the insulation film 5, and the sidewall insulation film SW3 of FIG. 2. The same configurations as those of the first circuit cell of FIG. 1 are given the same reference signs and numerals.

The study by the present inventors indicates that the gate electrode layer GL3 is required to project from the active regions ACTP1 and ACTN1 by a sufficient distance (length). Namely, it has been shown as follows: when the gate electrode layer GL3 is patterned by a photolithography technology and an etching technology, as indicated with a broken line in FIG. 23, the gate electrode layer GL3 is shortened, and the corner parts of the projection part come off, and are rounded. In other words, it has been revealed as follows: when the projection distance (D1) is short, the ends of the gate electrode layer GL3 are each in the shape indicated with a broken line in FIG. 23; this causes fluctuations in threshold value of the thin film p type MISFET Qp1 and the thin film n type MISFET Qn1.

Further, it has been shown that the active regions ACTPT and ACTNT are required to be sufficiently separated from the ends of the gate electrode layer GL3, respectively. This is for the following reason: for example, an n type impurity is ion-implanted into the active region ACTNT in order to form the n type tap NTAP; however, when the clearance (D2) between the end of the gate electrode layer GL3 and the active region ACTNT is small, the sidewall insulation film SW4 overlaps the active region ACTNT; this generates a region not ion-implanted with an n type impurity, resulting in fluctuations in resistance value of the n type tap NTAP.

In other words, as described above, a sufficient projection distance (D1) and clearance (D2) are required to be ensured, resulting in an increase in height of the circuit cell.

FIG. 24 is a plan view for illustrating the effects of the present First Embodiment. As shown in FIG. 24, the gate electrode GN1 of the thin film n type MISFET Qn1 of the first circuit cell and the gate electrode GN2 of the thin film n type MISFET Qn2 of the second circuit cell are integrally formed at the gate electrode layer GL. Then, the gate electrode layer GL crosses with the active region ACTPT (or, the reference potential wire VSS) extending in the X direction between the thin film n type MISFET Qn1 of the first circuit cell and the thin film n type MISFET Qn2 of the second circuit cell, and extends in the Y direction. In other words, the gate electrode layer GL does not have ends between the active regions ACTN1 and ACTN2, and the active region ACTPT. For this reason, it is not necessary to ensure the projection distance (D1) and the clearance (D2), which enables the reduction of the height of the first circuit cell. Incidentally, the distance (D3) between the active region ACTN1 or ACTN2 and the active region ACTPT shown in FIG. 24 can be set at the minimum dimension of the element isolation film STI. As shown in FIG. 24, the distance (D4) between the active region ACTP1 and the active region ACTNT corresponds to the sum of the projection distance (D1) and the clearance (D2) (D4=D1+D2). Therefore, the distance (D3) between the active region ACTN1 or ACTN2 and the active region ACTPT can be set smaller than the distance (D4) between the active region ACTP1 and the active region ACTNT (D3<D4 (=D1+D2)). In the case of the present embodiment, specifically, D1=0.11 μm, D2=0.04 μm, D3=0.12 μm, and D4=0.15 μm. In each of the first circuit cell and the second circuit cell in the Y direction, the shrinkage ratio (D3/D4) was able to be set at 80% (D3/D4=80%).

Further, with the cap insulation film 4 of a hard mask for processing the gate electrode GN1 of the thin film n type MISFET Qn1 by a dry etching method being left over the non-doped region GI, the ion implantation step for forming the p type high concentration semiconductor regions PH, and the formation step of the silicide layers SIL are carried out. The non-doped region GI is covered with the cap insulation film 4. For this reason, the p type impurity is not ion-implanted into the non-doped region GI. After the ion implantation step, the non-doped region GI can be kept in a state of an intrinsic semiconductor formed of an amorphous silicon film. Further, the formation step of the silicide layer SIL is carried out with the non-doped region GI being covered with the cap insulation film 4. Accordingly, the silicide layer SIL is not formed at the non-doped region GI. After the formation step of the silicide layer SIL, the non-doped region GI can be kept at a high resistance.

Incidentally, in the First Embodiment, SOTB was described as an example for the thin film n type MISFET and the thin film p type MISFET. However, FD-SOI or PD-SOI (Partially-Depleted Silicon on Insulator: partially-depleted type SOI) is also acceptable. Alternatively, the circuit cell may be formed of a bulk type p type MISFET and a bulk type n type MISFET. Still alternatively, the circuit cell may be formed of a bulk type high breakdown voltage p type MISFET and a bulk type high breakdown voltage n type MISFET having the same structure as that of an I/O transistor, or the like.

Further, the following example was described: under the power supply potential wire VDD, an n type tap NTAP and an n type well power feeder NWCNT are arranged, so that an electric power is fed to the n type well NW; and under the reference potential wire VSS, a p type tap PTAP and a p type well power feeder PWCNT are arranged, so that an electric power is fed to the p type well PW. However, the n type well power feeder NWCNT and the p type well power feeder PWCNT can also be omitted.

When the n type well power feeder NWCNT and the p type well power feeder PWCNT are omitted, the distance between the active regions ACTN1 adjacent to each other in the X direction, and the distance between the active regions ACTP1 adjacent to each other in the X direction can be reduced. Accordingly, the length in the X direction of the circuit cell can be reduced.

Modified Example 1

Figure 25:
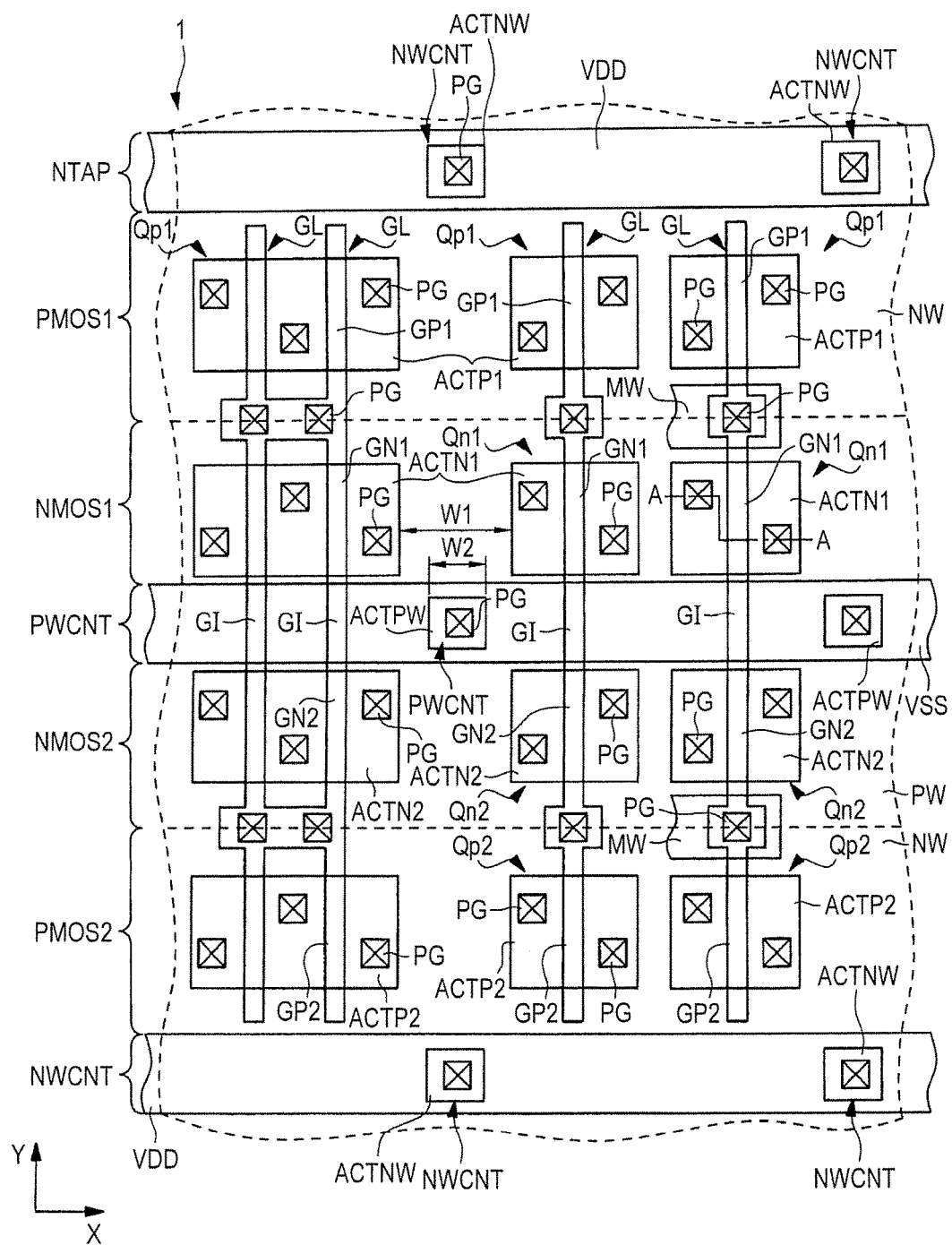
FIG. 25 is an essential plan view of a semiconductor device in accordance with Modified Example 1.

Modified Example 1 is an example obtained by omitting the p type tap PTAP and the n type tap NTAP of the First Embodiment. FIG. 25 is an essential part plan view of a semiconductor device in accordance with Modified Example 1. The same configurations as those of the First Embodiment are given the same reference signs and numerals.

Under the reference potential wire VSS, a plurality of p type well power feeders PWCNT are arranged at a prescribed interval in the X direction. However, each active region ACTPW in which the p type well power feeder PWCNT is formed does not overlap the active regions ACTN1 and ACTN2 in the X direction and the Y direction. In other words, even when the active regions ACTPW are translated in the Y direction, the active regions ACTPW do not overlap the active regions ACTN1 and ACTN2, and overlap only the element isolation films STI. Therefore, in the region in which the p type well power feeder PWCNT is arranged, the distance (W1) between the active regions ACTN1 adjacent to each other in the the X direction is larger than the width (W2) of the active region ACTPW in the X direction. In the region in which the p type well power feeder PWCNT is not arranged, the distance between the active regions ACTN1 adjacent to each other in the the X direction is narrower than the W1. This also applies to the distance between the active regions ACTN2 adjacent to each other in the the X direction.

Such an arrangement can reduce the distance between the active regions ACTN1 and ACTN2 adjacent to each other in the the Y direction, and can reduce the height of the circuit cell.

Further, the relationship between the active region ACTNW of the n type well power feeder NWCNT, and the active regions ACTP1 and ACTP2 is also the same as the relationship between the active region ACTPW and the active regions ACTN1 and ACTN2.

Modified Example 2

Figure 26:
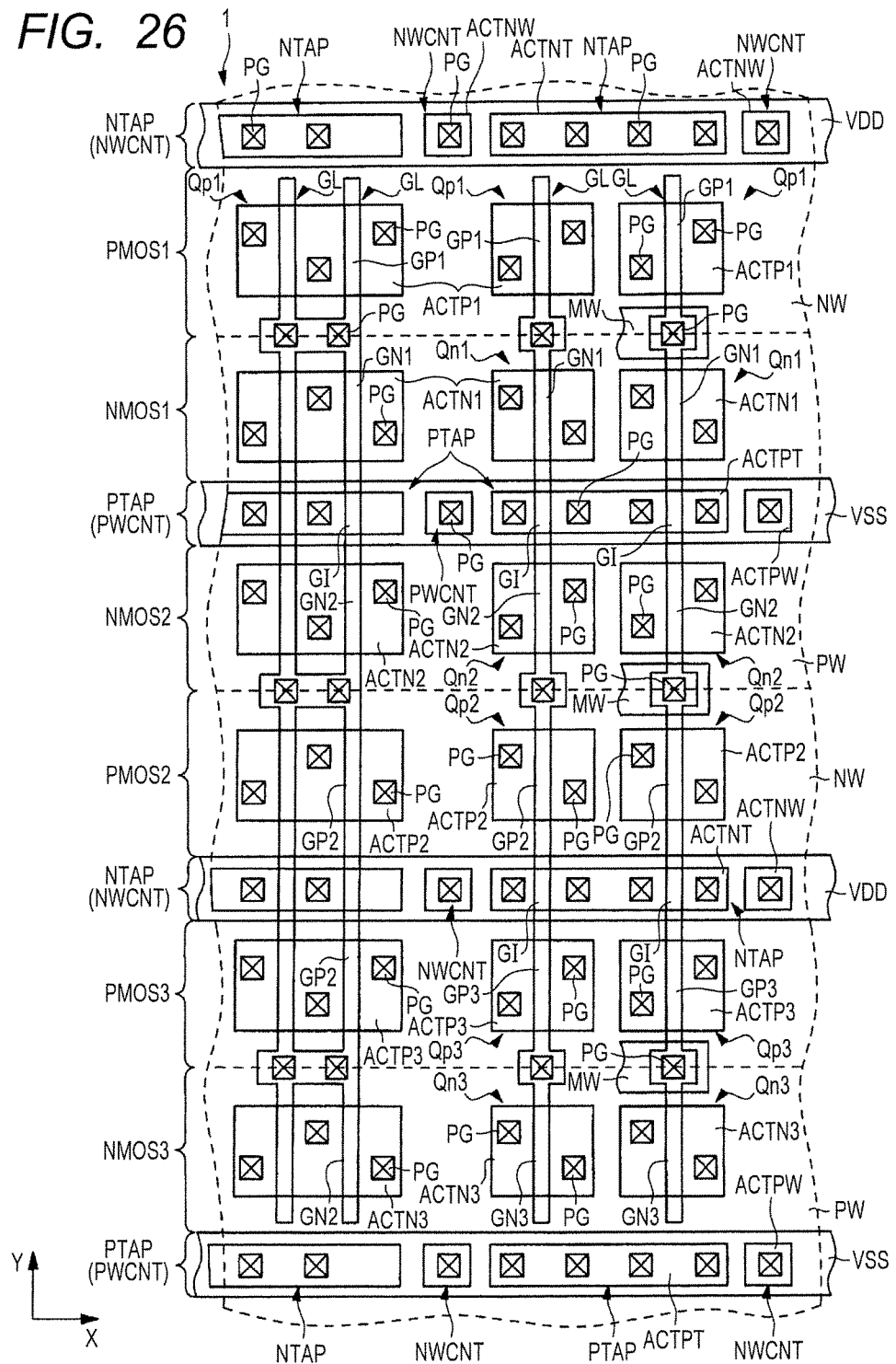
FIG. 26 is an essential part plan view of a semiconductor device in accordance with Modified Example 2.

Modified Example 2 is an example obtained by adding a third circuit cell to the First Embodiment. FIG. 26 is an essential part plan view of a semiconductor device in accordance with Modified Example 2. The third circuit cell has, as with the first circuit cell and the second circuit cell, a power supply potential wire VDD and a reference potential wire VSS extending in the X direction, and has a PMOS formation region PMOS3 and an NMOS formation region NMOS3 between the power supply potential wire VDD and the reference potential wire VSS. In the PMOS formation region PMOS3, a plurality of thin film p type MISFETs Qp3 are arranged, and in the NMOS formation region NMOS3, a plurality of thin film n type MISFETs Qn3 are arranged, along the X direction, respectively. The thin film p type MISFET Qp3 has the same structure as those of the thin film p type MISFETs Qp1 and Qp2, and has a gate electrode GP3 and an active region ACTP3. The plurality of thin film n type MISFETs Qn3 each have the same structure as those of the thin film n type MISFETs Qn1 and Qn2, and has a gate electrode GN3 and an active region ACTN3.

In Modified Example 2, as shown in FIG. 26, active regions ACTP1, ACTN1, ACTPT, ACTN2, ACTP2, ACTNT, ACTP3, and ACTN3 are sequentially arranged in the Y direction, and the gate electrode layer GL crosses with respective active regions, and extends in the Y direction. In the gate electrode layer GL, the p type gate electrode GP1, the n type gate electrode GN1, the non-doped region GI, the n type gate electrode GN2, the p type gate electrode GP2, the non-doped region GI, the p type gate electrode GP3, and the n type gate electrode GN3 are sequentially formed.

The p type gate electrode GP1 and the n type gate electrode GN1 are electrically short-circuited from each other by the silicide layer SIL formed at the top surfaces of the gate electrodes GP1 and GN1, and are coupled with the metal wire MW via the plug electrode PG. The n type gate electrode GN2 and the p type gate electrode GP2 are electrically short-circuited from each other by the silicide layer SIL formed at the top surfaces of the gate electrodes GN2 and GP2, and are coupled with the metal wire MW via the plug electrode PG. The p type gate electrode GP3 and the n type gate electrode GN3 are electrically short-circuited from each other by the silicide layer SIL formed at the top surfaces of the gate electrodes GP3 and GN3, and are coupled with the metal wire MW via the plug electrode PG. Then, the non-doped region GI arranged between the gate electrodes GN1 and GN2 electrically isolates the gate electrodes GN1 and GN2 from each other. Further, the non-doped region GI arranged between the gate electrodes GP2 and GP3 electrically isolates the gate electrodes GP2 and GP3 from each other. Then, the gate electrode layer GL extends to cross with the reference potential wire VSS and the power supply potential wire VDD. The two non-doped regions GI are arranged at the positions overlapping the reference potential wire VSS and the power supply potential wire VDD, respectively.

The gate electrodes GP1, GN1, GN2, GP2, GP3, and GN3 of three stages of the circuit cells are integrally formed at the gate electrode layer GL in this manner. As a result, it is possible to reduce the height of each circuit cell.

Second Embodiment

Figure 27:
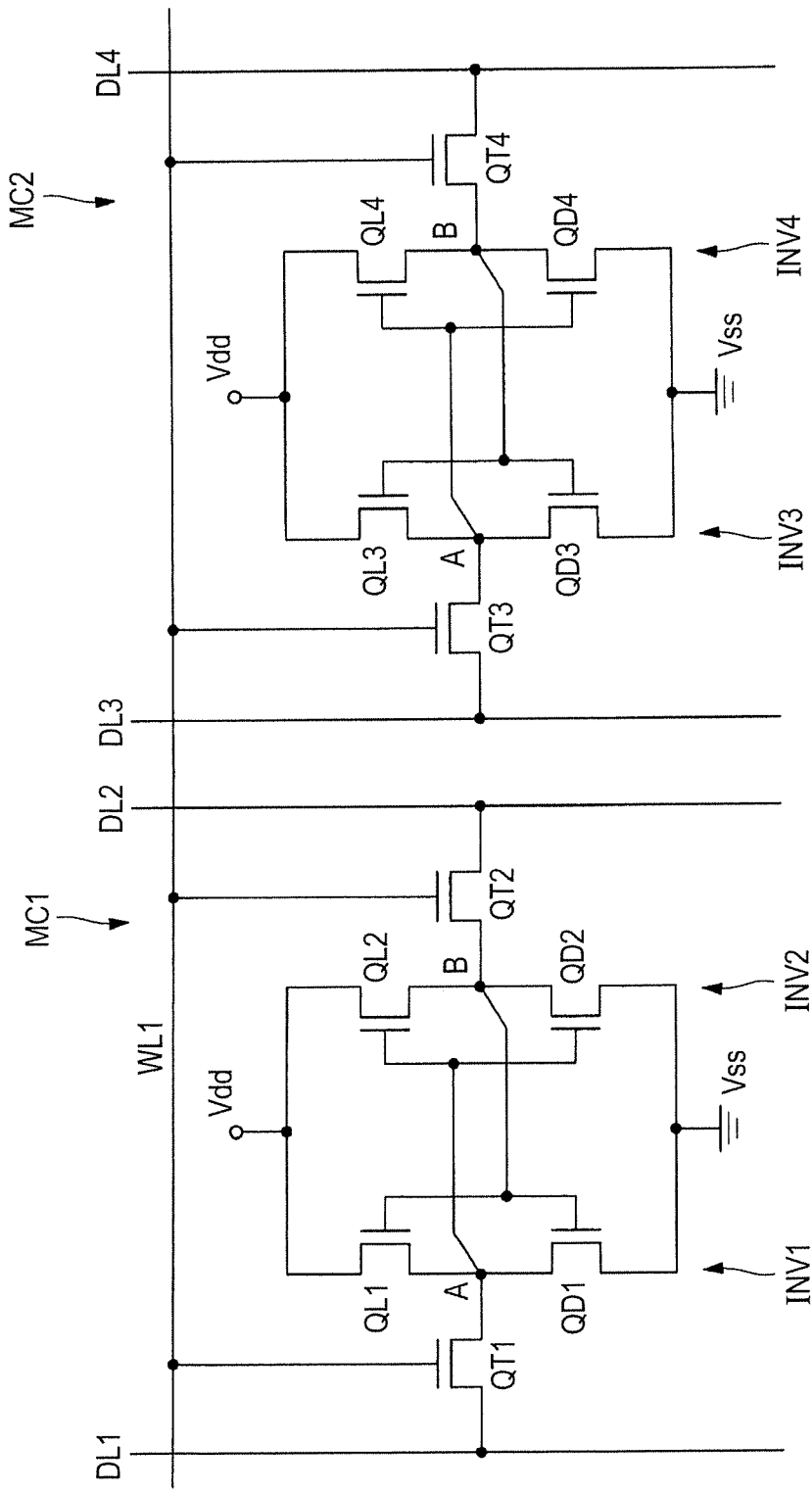
FIG. 27 is an equivalent circuit diagram showing a SRAM memory cell in accordance with Second Embodiment.
Figure 28:
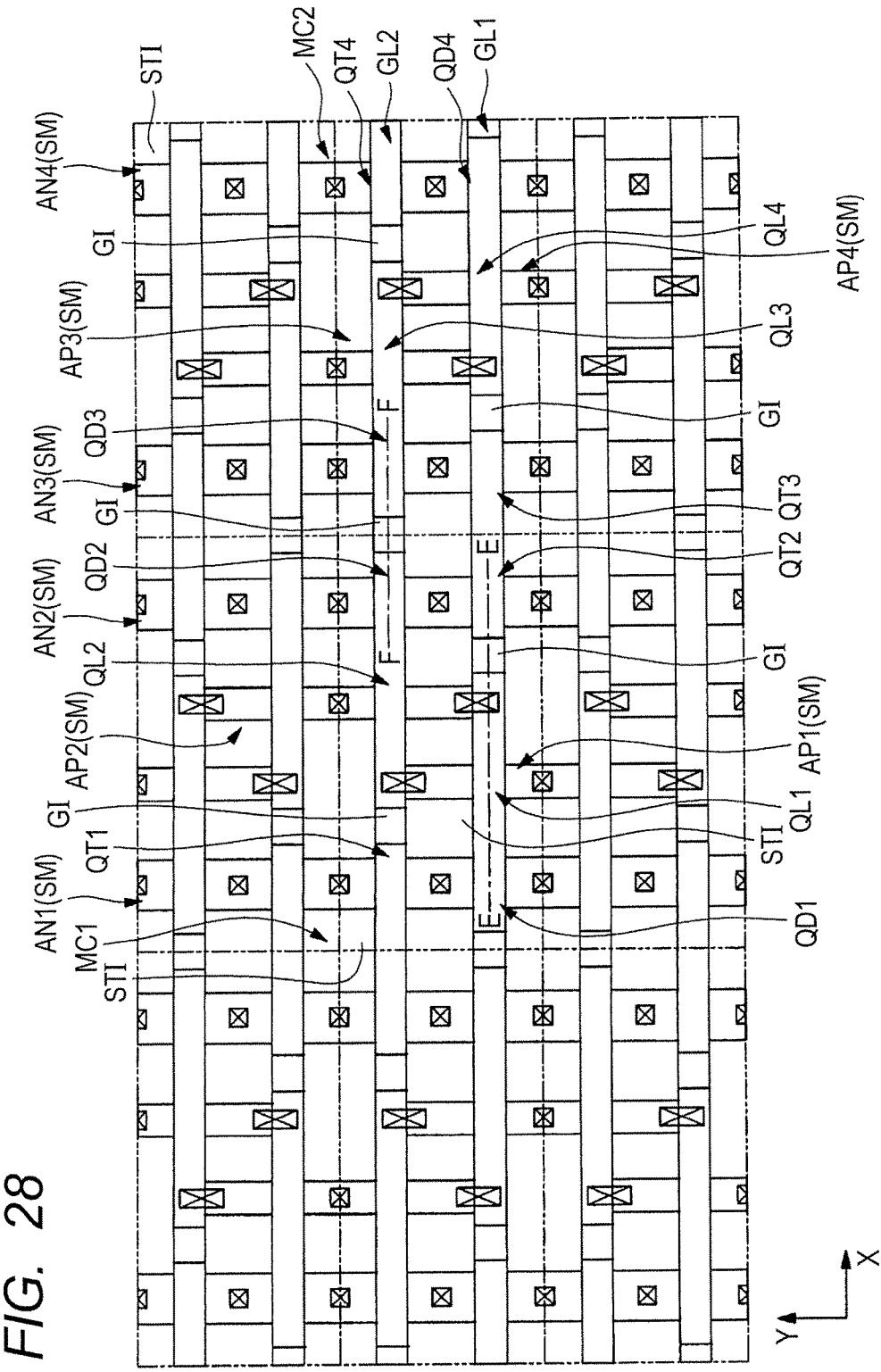
FIG. 28 is a plan layout view showing a plurality of memory cells of the SRAM in accordance with Second Embodiment.
Figure 29:
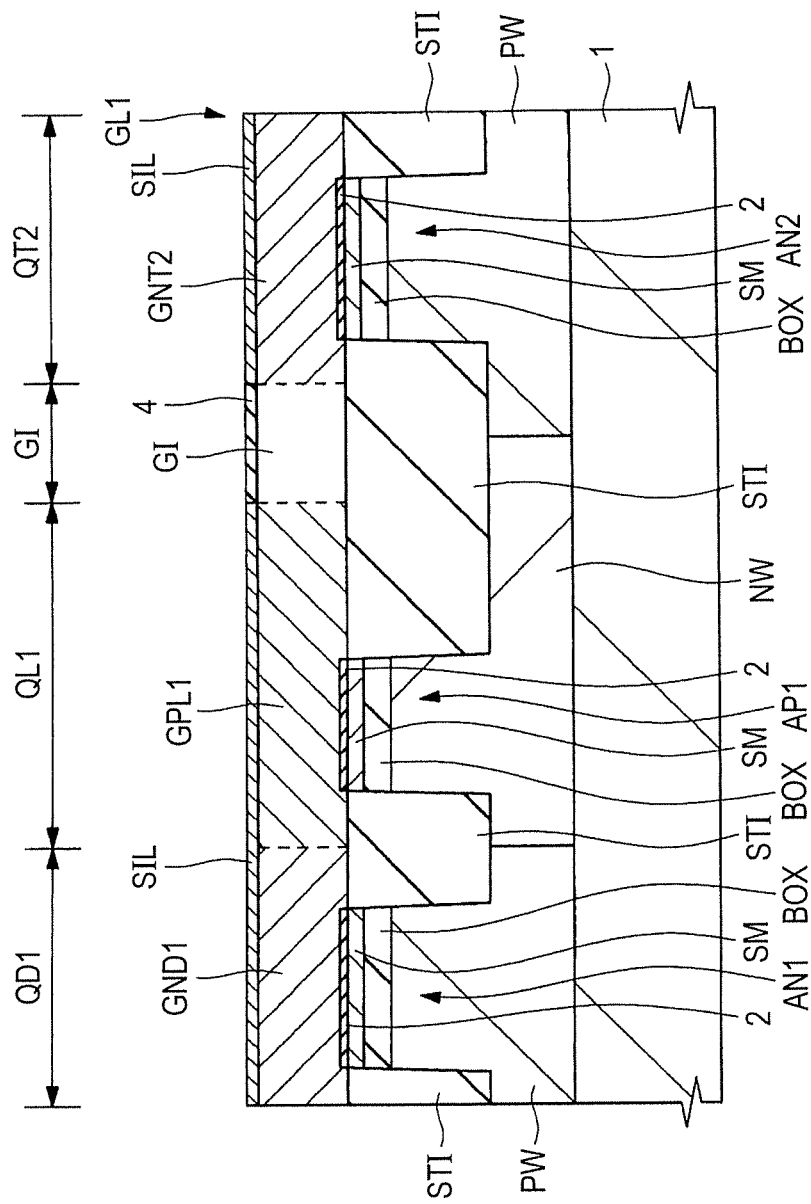
FIG. 29 is a cross sectional view along line E-E of FIG. 28.
Figure 30:
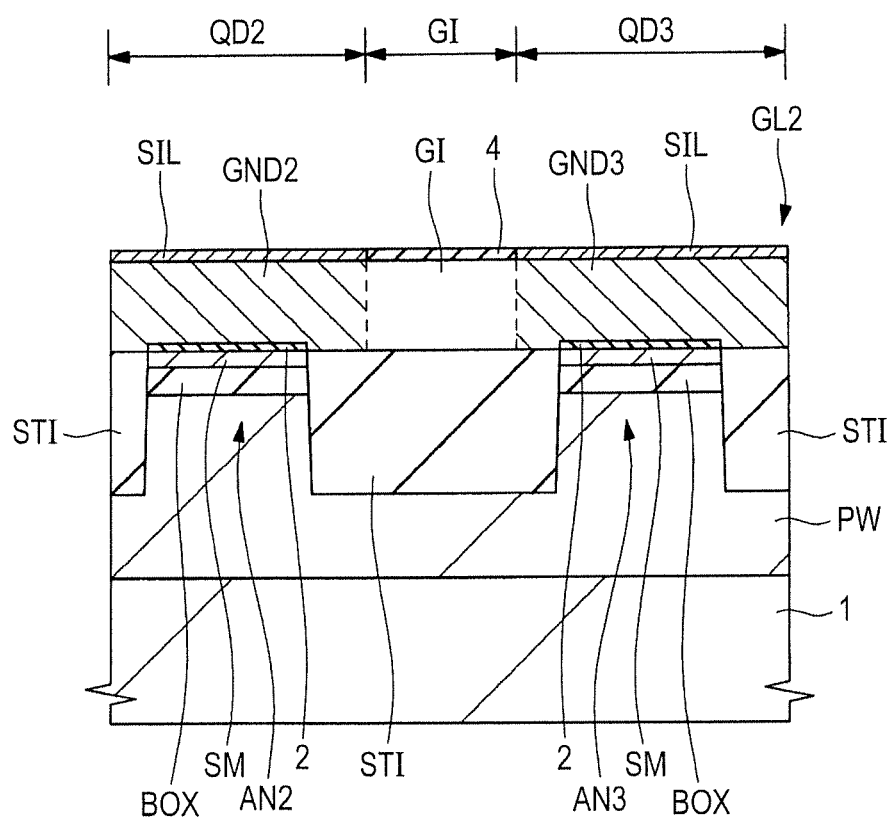
FIG. 30 is a cross sectional view along line F-F of FIG. 28.
Figure 31:
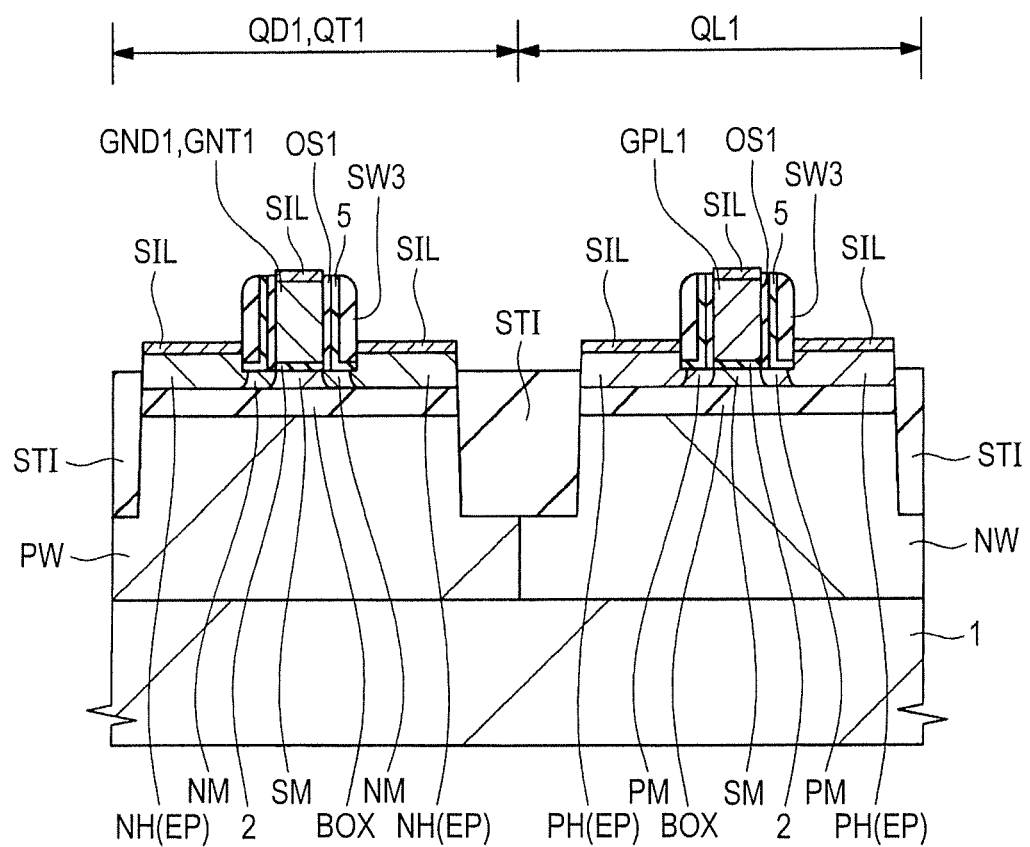
FIG. 31 is a cross sectional view of MISFETs forming the memory cell of the SRAM.

Second Embodiment is an example obtained by applying the concept of the integral formation of electrically independent gate electrodes in the First Embodiment to a SRAM memory cell. FIG. 27 is an equivalent circuit diagram showing memory cells of a SRAM in accordance with Second Embodiment. FIG. 28 is a plan layout view showing a plurality of memory cells of the SRAM in accordance with Second Embodiment. FIG. 29 is a cross sectional view along line E-E of FIG. 28. FIG. 30 is a cross sectional view along line F-F of FIG. 28. FIG. 31 is a cross sectional view of MISFETs forming a memory cell.

First, a description will be given to the equivalent circuit of the two adjacent memory cells forming the SRAM. As shown in FIG. 27, a memory cell MC1 is arranged at the crossing part between a data line DL1 and a data line DL2 of a pair of complementary data lines, i.e., a pair of bit lines, and a word line WL1, and includes a driving transistor, a load transistor, and a transfer transistor. In other words, the memory cell MC1 of the SRAM is formed of a pair of driving MISFETs QD1 and QD2, a pair of load MISFETs QL1 and QL2, and a pair of transfer MISFETs QT1 and QT2. The driving MISFETs QD1 and QD2 and the transfer MISFETs QT1 and QT2 are formed of n channel type MISFETs, and the load MISFETs QL1 and QL2 are formed of p channel type MISFETs.

Of the six MISFETs forming the memory cell MC1, the driving MISFET QD1 and the load MISFET QL1 form a CMIS (Complementary Metal Insulator Semiconductor) inverter INV1, and the driving MISFET QD2 and the load MISFET QL2 form a CMIS inverter INV2. The storage nodes A and B of mutual input/output terminals of the pair of CMIS inverters INV1 and INV2 are cross-coupled, and form a flip-flop circuit as an information storage part for storing 1-bit information. Further, the storage node A of one input/output terminal of the flip-flop circuit is coupled to one of the source region and the drain region of the transfer MISFET QT1. The storage node B of the other input/output terminal is coupled to one of the source/drain regions of the transfer MISFET QT2.

Further, the other of the source/drain regions of the transfer MISFET QT1 is coupled with the data line DL1. The other of the source/drain regions of the transfer MISFET QT2 is coupled with the data line DL2. Whereas, one end of the flip-flop circuit, i.e., each source region of the load MISFETs QL1 and QL2 is coupled with the power supply voltage Vdd. The other end, i.e., each source region of the driving MISFETs QD1 and QD2 is coupled with the reference voltage Vss. The drain of the load MISFET QL1 and the drain of the driving MISFET QD1 are coupled with, for example, the storage node A, and the gate of the load MISFET QL1 and the gate of the driving MISFET QD1 are coupled with the storage node B. Then, the drain of the load MISFET QL2 and the drain of the driving MISFET QD2 are coupled with, for example, the storage node B, and the gate of the load MISFET QL2 and the gate of the driving MISFET QD2 are coupled with the storage node A.

The memory cell MC2 is arranged at the crossing part between a data line DL3 and a data line DL4 of a pair of complementary data lines, i.e., a pair of bit lines, and a word line WL1, and includes a driving transistor, a load transistor, and a transfer transistor. The memory cell MC2 is formed of a pair of driving MISFETs QD3 and QD4, a pair of load MISFETs QL3 and QL4, and a pair of transfer MISFETs QT3 and QT4. The memory cell MC2 has the same structure as that of the memory cell MC1. The description of the memory cell MC1 may be substituted for the description thereon.

FIG. 28 shows a plan layout of a plurality of memory cells arranged in a matrix, and shows a total of nine memory cells in the X direction and the Y direction with the memory cell MC1 as the center. Incidentally, for ease of understanding of the drawing, herein, the boundary between respective memory cells MC arranged in a matrix is defined and indicated with a two-dot chain line. The memory cell MC2 is arranged line symmetrically on the right side with respect to the two-dot chain line of the boundary with the memory cell MC1 as the axis. Thus, the memory cells adjacent to each other in the Y direction or the X direction have a line symmetrical layout with respect to the two-dot chain line as the axis.

The semiconductor layer SM is partitioned by the element isolation films STI into a plurality of active regions AN1, AN2, AP1, and AP2. In other words, the peripheries of the active regions AN1, AN2, AP1, and AP2 are surrounded by the element isolation films STI. The plurality of active regions AN1, AP1, AP2, and AN2 extending in the Y direction are arranged side by side in the X direction. Further, the gate electrode layers GL1 and GL2 extend in the X direction, and are arranged in the Y direction.

Then, the memory cell MC1 will be described. The driving MISFET QD1 is arranged at the crossing part between the gate electrode layer GL1 and the active region AN1; the load MISFET QL1, at the crossing part between the gate electrode layer GL1 and the active region AP1; and the transfer MISFET QT2, at the crossing part between the gate electrode layer GL1 and the active region AN2. Whereas, the transfer MISFET QT1 is arranged at the crossing part between the gate electrode layer GL2 and the active region AP1; the load MISFET QL2, at the crossing part between the gate electrode layer GL2 and the active region AP2; and the driving MISFET QD2, at the crossing part between the gate electrode layer GL2 and the active region AN2.

Then, the memory cell MC2 will be described. The transfer MISFET QT3 is arranged at the crossing part between the gate electrode layer GL1 and the active region AN3; the load MISFET QL4, at the crossing part between the gate electrode layer GL1 and the active region AP4; and, the driving MISFET QD4, at the crossing part between the gate electrode layer GL1 and the active region AN4. Whereas, the driving MISFET QD3 is arranged at the crossing part between the gate electrode layer GL2 and the active region AN3; the load MISFET QL3, at the crossing part between the gate electrode layer GL2 and the active region AP3; and the transfer MISFET QT4, at the crossing part between the gate electrode layer GL2 and the active region AN4.

Incidentally, in FIG. 28, the data lines DL1, DL2, DL3, and DL4, and the word line WL1 are not shown, but the data lines DL1, DL2, DL3, and DL4 extend in the Y direction, and the word line WL1 extends in the X direction.

As shown in FIG. 29, the active regions AN1, AP1, and AN2 are sequentially formed in the p type well layer PW, the n type well layer NW, and the p type well layer PW, respectively. Then, the gate electrode layer GL1 continuously extends over the active regions AN1, AP1, and AN2, and the element isolation films STI. At the gate electrode layer GL1, sequentially, the gate electrode GND1 of the driving MISFET QD1, the gate electrode GPL1 of the load MISFET QL1, the non-doped region GI, and the gate electrode GNT2 of the transfer MISFET QT2 are formed. The gate electrodes GND1 and GNT2 are each an n type semiconductor formed of a polycrystal silicon film. The gate electrode GPL1 is a p type semiconductor formed of a polycrystal silicon film. The non-doped region GI is an intrinsic semiconductor formed of an amorphous silicon film. The non-doped region GI is entirely arranged over the element isolation film STI. The gate electrodes GND1 and GPL1 are electrically short-circuited from each other by the silicide layer SIL formed continuously at the top surfaces thereof. A silicide layer SIL is also formed at the top surface of the gate electrode GNT2. At the top surface of the non-doped region GI, a silicide layer SIL is not formed, and the entire top surface is covered with a cap insulation film 4. In other words, the gate electrode GPL1 and the gate electrode GNT2 are electrically isolated from each other by the non-doped region GI formed of an intrinsic semiconductor. As described previously, the sheet resistance of the gate electrode GPL1 formed of a p type polycrystal silicon film is 330 $\Omega/\square$; the sheet resistance of the gate electrode GNT2 formed of an n type polycrystal silicon film is 130 $\Omega/\square$; and the sheet resistance of the non-doped region GI formed of an amorphous silicon film is 1,000 K$\Omega/\square$ or more. For this reason, the gate electrode GPL1 and the gate electrode GNT2 are electrically insulated from each other by the non-doped region GI.

Alternatively, it can also be said that, in the memory cell MC1, the gate electrode GPL1 of the load MISFET QL1 and the gate electrode GNT2 of the transfer MISFET QT2 are integrally formed at the gate electrode layer GL1 formed of a polycrystal silicon film, and that the gate electrode GPL1 and the gate electrode GNT2 are electrically isolated from each other by the non-doped region GI. Further, attention will be paid to the gate electrode layer GL2 shown in FIG. 28. Then, as with the foregoing description, it can also be said that, in the memory cell MC1, the gate electrode of the load MISFET QL2 and the gate electrode of the transfer MISFET QT1 are integrally formed at the gate electrode layer GL2 formed of a polycrystal silicon film, and that the gate electrode of the load MISFET QL2 and the gate electrode of the transfer MISFET QT1 are electrically isolated from each other by the non-doped region GI.

As shown in FIG. 30, the gate electrode layer GL2 continuously extends over the active regions AN2 and AN3, and the element isolation films STI. Then, at the gate electrode layer GL2, sequentially, the gate electrode GND2 of the driving MISFET QD2, the non-doped region GI, and the gate electrode GND3 of the driving MISFET QD3 are formed. The gate electrodes GND2 and GND3 are each an n type semiconductor, and silicide layers SIL are formed at the top surfaces thereof, respectively. The non-doped region GI is an intrinsic semiconductor, and electrically isolates the gate electrode GND2 from the gate electrode GND3. Further, the top surface of the non-doped region GI is entirely covered with the cap insulation film 4, and a silicide layer SIL is not formed thereover. The non-doped region GI is entirely arranged over the element isolation film STI.

In other words, the gate electrode GND2 of the driving MISFET QD2 of the memory cell MC1, and the gate electrode GND3 of the driving MISFET QD3 of the memory cell MC2 are integrally formed at the gate electrode layer GL2 formed of a polycrystal silicon film, and the gate electrode GND2 and the gate electrode GND3 are electrically isolated from each other by the non-doped region GI.

FIG. 31 shows cross sectional views of the n type driving MISFET and the n type transfer MISFET, and the p type load MISFET, forming the memory cell of a SRAM. In FIG. 31, the driving MISFET QD1 and the transfer MISFET QT1, and the load MISFET QL1 are shown as representatives.

The driving MISFET QD1 and the transfer MISFET QT1 each have the same structure as that of the thin film n type MISFET Qn1 described in First Embodiment. The load MISFET QL1 has the same structure as that of the thin film p type MISFET Qp1 described in First Embodiment.

In accordance with the present Second Embodiment, in the memory cell MC1, the gate electrode GPL1 of the load MISFET QL1 and the gate electrode GNT2 of the transfer MISFET QT2 are integrally formed at the gate electrode layer GL1, and the gate electrode GPL1 and the gate electrode GNT2 are electrically isolated from each other by the non-doped region GI. For this reason, the cell size in the word line direction of the memory cell MC1 can be more reduced than when the gate electrode GPL1 and the gate electrode GNT2 are formed at different polycrystal silicon layers, respectively.

Further, the gate electrode GND2 of the driving MISFET QD2 and the gate electrode GND3 of the driving MISFET QD3 forming the adjacent memory cells MC1 and MC2, respectively, are integrally formed at the gate electrode layer GL2. As a result, the distance between the adjacent memory cells MC1 and MC2 can be reduced, which can implement the shrinkage of the memory cell array.

Up to this point, the invention completed by the the present inventors was specifically described by way of embodiments thereof. However, it is naturally understood that the present invention is not limited to the embodiments, and may be changed variously within the scope not departing from the gist thereof.

In addition, the contents described in the embodiments will be partially described below.

Additional Statement 1

A method for manufacturing a semiconductor device, including the steps of:

(a) providing a semiconductor substrate having a first region and a second region at a main surface thereof, and including a semiconductor layer formed over the main surface via a first insulation film in the first region, (b) sequentially depositing a first silicon film and a first silicon nitride film over the semiconductor layer, and over the semiconductor substrate, (c) patterning the first silicon film and the first silicon nitride film, and forming a first lamination structure formed of a first silicon piece and a first silicon nitride piece in the first region, and a second lamination structure formed of a second silicon piece and a second silicon nitride piece in the second region, (d) sequentially depositing a first silicon oxide film and a second silicon nitride film in such a manner as to cover the first lamination structure and the second lamination structure, (e) performing anisotropic dry etching on the second silicon nitride film and the first silicon oxide film in the first region with the second region covered with a first mask film, and forming a first sidewall insulation film formed of the first silicon oxide film and the second silicon nitride film over the sidewall of the first lamination structure, (f) forming a second silicon film at the surface of the semiconductor layer in the first region with the second region covered with the second silicon nitride film by an epitaxial growth method, (g) removing the first silicon nitride piece and the second silicon nitride film forming the first sidewall insulation film in the first region, and the second silicon nitride film covering the first silicon oxide film in the second region, (h) depositing a third silicon nitride film in such a manner as to cover the first silicon piece and the second lamination structure, and then, performing anisotropic dry etching on the third silicon nitride film, and forming a second sidewall insulation film formed of the third silicon nitride film over the sidewall of the first silicon piece via the first silicon oxide film in the first region, and a third sidewall insulation film formed of the third silicon nitride film over the sidewall of the second silicon piece via the first silicon oxide film in the second region, and (i) ion-implanting a first impurity of a first conductivity type into the second region with the the second silicon piece covered with the second silicon nitride piece, and forming a first semiconductor region of the first conductivity type at the main surface of the semiconductor substrate, wherein, in the step (i), the second silicon nitride piece functions as a mask for the ion implantation, so that the second silicon piece is not doped with the first impurity.

Additional Statement 2

The method for manufacturing a semiconductor device according to Additional Statement 1, further including, after the step (i), a step (j) of forming a silicide layer at the surface of the first semiconductor region in the second region with the second silicon piece covered with the second silicon nitride piece.

Additional Statement 3

The method for manufacturing a semiconductor device according to Additional Statement 1, further including the steps of:

(k) ion-implanting a second impurity of a second conductivity type of the opposite conductivity type to the first conductivity type into the first silicon piece and the second silicon film in the first region, and (l) subjecting the first silicon piece and the second silicon film to a heat treatment for activating the second impurity.

Additional Statement 4

The method for manufacturing a semiconductor device according to Additional Statement 3, wherein, after the step (l), the first silicon film is a polycrystal silicon film, and the second silicon piece is an amorphous silicon film.

Additional Statement 5

A semiconductor device having:
first and second bit lines extending along a first direction,
a word line extending along a second direction orthogonal to the first direction, and
a memory cell coupled with the first and second bit lines, and the word line,
the memory cell having:
a first load MISFET of a first conductivity type, having a first drain, a first source, and a first gate, the first drain being coupled with a first storage node, and the first gate being coupled with a second storage node,
a first driving MISFET of a second conductivity type of the opposite conductivity type to the first conductivity type, having a second drain, a second source, and a second gate, the second gate being coupled with the second storage node,
a second load MISFET of the first conductivity type, having a third drain, a third source, and a third gate, the third gate being coupled with the first storage node,
a second driving MISFET of the second conductivity type, having a fourth drain, a fourth source, and a fourth gate, the fourth gate being coupled with the first storage node,
a first transfer MISFET of the second conductivity type, having a fifth gate, the fifth gate being electrically coupled with the word line, and electrically coupling the first bit line and the first storage node, and a second transfer MISFET of the second conductivity type having a sixth gate, the sixth gate being electrically coupled with the word line, and electrically coupling the second bit line and the second storage node, wherein the first gate of the first conductivity type and the sixth gate of the second conductivity type are integrally formed at a gate electrode layer, and wherein a non-doped region is interposed between the first gate and the sixth gate.

Additional Statement 6

The semiconductor device according to Additional Statement 5, wherein the first gate is formed of a first polycrystal silicon film of the first conductivity type, wherein the sixth gate is formed of a second polycrystal silicon film of the second conductivity type, and wherein the non-doped region is formed of an amorphous silicon film.

Additional Statement 7

The semiconductor device according to Additional Statement 6, wherein the sheet resistance of the amorphous silicon film is 1000 times or more the sheet resistance of the first polycrystal silicon film, and 1000 times or more the sheet resistance of the second polycrystal silicon film.

Additional Statement 8

The semiconductor device according to Additional Statement 6, wherein the top surface of the first polycrystal silicon film is in contact with a first silicide layer, wherein the top surface of the second polycrystal silicon film is in contact with a second silicide layer, and wherein the top surface of the amorphous silicon film is in contact with a silicon nitride film.

Additional Statement 9

A semiconductor device having:

first, second, third, and fourth bit lines extending along a first direction, a word line extending along a second direction orthogonal to the first direction, a first memory cell coupled with the first and second bit lines, and the word line, and a second memory cell coupled with the third and fourth bit lines, and the word line, the first memory cell having:

a first load MISFET of a first conductivity type, having a first drain, a first source, and a first gate, the first drain being coupled with a first storage node, and the first gate being coupled with a second storage node, a first driving MISFET of a second conductivity type of the opposite conductivity type to the first conductivity type, having a second drain, a second source, and a second gate, the second gate being coupled with the second storage node, a second load MISFET of the first conductivity type, having a third drain, a third source, and a third gate, the third gate being coupled with the first storage node, a second driving MISFET of the second conductivity type, having a fourth drain, a fourth source, and a fourth gate, the fourth gate being coupled with the first storage node, a first transfer MISFET of the second conductivity type, having a fifth gate, the fifth gate being electrically coupled with the word line, and electrically coupling the first bit line and the first storage node, and a second transfer MISFET of the second conductivity type, having a sixth gate, the sixth gate being electrically coupled with the word line, and electrically coupling the second bit line and the second storage node, the second memory cell having:

a third load MISFET of a first conductivity type, having a seventh drain, a seventh source, and a seventh gate, the seventh drain being coupled with a third storage node, and the seventh gate being coupled with a fourth storage node, a third driving MISFET of a second conductivity type of the opposite conductivity type to the first conductivity type, having an eighth drain, an eighth source, and an eighth gate, the eighth gate being coupled with the fourth storage node, a fourth load MISFET of the first conductivity type, having a ninth drain, a ninth source, and a ninth gate, the ninth gate being coupled with the third storage node, a fourth driving MISFET of the second conductivity type, having a tenth drain, a tenth source, and a tenth gate, the tenth gate being coupled with the third storage node, a third transfer MISFET of the second conductivity type, having an eleventh gate, the eleventh gate being electrically coupled with the word line, and electrically coupling the third bit line and the third storage node, and a fourth transfer MISFET of the second conductivity type, having a twelfth gate, the twelfth gate being electrically coupled with the word line, and electrically coupling the fourth bit line and the fourth storage node, wherein the first memory cell and the second memory cell are adjacent to each other in the direction of extension of the word line, wherein the fourth gate of the second driving MISFET, and the eighth gate of the third driving MISFET are integrally formed at a gate electrode layer, and wherein a non-doped region is interposed between the fourth gate and the eighth gate.

Additional Statement 10

The semiconductor device according to Additional Statement 9, wherein the fourth gate is formed of a first polycrystal silicon film of the second conductivity type, wherein the eighth gate is formed of a second polycrystal silicon film of the second conductivity type, and wherein the non-doped region is formed of an amorphous silicon film.

Additional Statement 11

The semiconductor device according to Additional Statement 10, wherein the sheet resistance of the amorphous silicon film is 1000 times or more the sheet resistance of the first polycrystal silicon film, and 1000 times or more the sheet resistance of the second polycrystal silicon film.

Additional Statement 12

The semiconductor device according to Additional Statement 10, wherein the top surface of the first polycrystal silicon film is in contact with a first silicide layer, wherein the top surface of the second polycrystal silicon film is in contact with a second silicide layer, and wherein the top surface of the amorphous silicon film is in contact with a silicon nitride film.

What is claimed is:

1. A method of manufacturing a semiconductor device, including the steps of: (a) providing a semiconductor substrate having a first region and a second region at a main surface thereof, and including a semiconductor layer formed over the main surface via a first insulation film in the first region,
   (b) after the step (a), sequentially depositing a first silicon film and a first silicon nitride film over the semiconductor layer, and over the semiconductor substrate,
   (c) after the step (b), patterning the first silicon film and the first silicon nitride film, and forming a first lamination structure formed of a first silicon piece and a first silicon nitride piece in the first region, and a second lamination structure formed of a second silicon piece and a second silicon nitride piece in the second region,
   (d) after the step (c), sequentially depositing a first silicon oxide film and a second silicon nitride film in such a manner as to cover the first lamination structure and the second lamination structure,
   (e) after the step (d), performing anisotropic dry etching on the second silicon nitride film and the first silicon oxide film in the first region with the second region covered with a first mask film, and forming a first sidewall insulation film formed of the first silicon oxide film and the second silicon nitride film over the sidewall of the first lamination structure,
   (f) after the step (e), fanning a second silicon film at the surface of the semiconductor layer in the first region with the second region covered with the second silicon nitride film by an epitaxial growth method,
   (g) after the step (f), removing the first silicon nitride piece and the second silicon nitride film forming the first sidewall insulation film in the first region, and the second silicon nitride film covering the first silicon oxide film in the second region,
   (h) after the step (g), depositing a third silicon nitride film in such a manner as to cover the first silicon piece and the second lamination structure, and then, performing anisotropic dry etching on the third silicon nitride film, and forming a second sidewall insulation film formed of the third silicon nitride film over the sidewall of the first silicon piece via the first silicon oxide film in the first region, and a third sidewall insulation film formed of the third silicon nitride film over the sidewall of the second silicon piece via the first silicon oxide film in the second region, and
   (i) after the step (h), ion-implanting a first impurity of a first conductivity type into the second region with the second silicon piece covered with the second silicon nitride piece, and forming a first semiconductor region of the first conductivity type at the main surface of the semiconductor substrate,
   wherein, in the step (i), the second silicon piece is not doped with the first impurity so that the second silicon nitride piece functions as a mask for the ion implantation.

2. The method according to claim 1, further including, after the step (i), a step (j) of forming a silicide layer at the surface of the first semiconductor region in the second region with the second silicon piece covered with the second silicon nitride piece.

3. The method according to claim 1, further including the steps of:
   (k) ion-implanting a second impurity of a second conductivity type of the opposite conductivity type to the first conductivity type into the first silicon piece and the second silicon film in the first region, and
   (l) after the step (k), subjecting the first silicon piece and the second silicon film to a heat treatment for activating the second impurity.

4. The method according to claim 3,
   wherein, after the step (l), the first silicon film is a polycrystal silicon film, and the second silicon piece is an amorphous silicon film.

* * * * *